(12) United States Patent
Schaller

(10) Patent No.: US 8,945,308 B2
(45) Date of Patent: Feb. 3, 2015

(54) TRANSFER CHAMBER WITH VACUUM EXTENSION FOR SHUTTER DISKS

(75) Inventor: Jason Schaller, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 118 days.

(21) Appl. No.: 13/589,631

(22) Filed: Aug. 20, 2012

(65) Prior Publication Data

US 2012/0325140 A1 Dec. 27, 2012

Related U.S. Application Data

(63) Continuation of application No. 12/117,945, filed on May 9, 2008, now abandoned.

(60) Provisional application No. 60/916,921, filed on May 9, 2007, provisional application No. 60/916,924, filed on May 9, 2007, provisional application No. 60/916,932, filed on May 9, 2007.

(51) Int. Cl.
C23C 14/34 (2006.01)
C23C 14/56 (2006.01)
H01L 21/67 (2006.01)
H01L 21/677 (2006.01)

(52) U.S. Cl.
CPC ........ C23C 14/568 (2013.01); H01L 21/67173 (2013.01); H01L 21/67184 (2013.01); H01L 21/67196 (2013.01); H01L 21/67742 (2013.01)
USPC ...... 118/719; 204/298.25; 118/728; 118/733; 118/500; 118/66

(58) Field of Classification Search
CPC .............. H01L 21/00; H01L 21/02008; H01L 21/67196; H01L 21/67745; H01I 21/67167; H01J 37/32733
USPC ........ 204/298.25; 118/719, 728, 733, 500, 66
See application file for complete search history.

(56) References Cited

U.S. PATENT DOCUMENTS

| 4,951,601 A | * | 8/1990 | Maydan et al. ................ 118/719 |
| 5,186,718 A | | 2/1993 | Tepman et al. |
| 5,620,578 A | | 4/1997 | Hurwitt |
| 5,628,828 A | | 5/1997 | Kawamura et al. |

(Continued)

OTHER PUBLICATIONS

First Office Action dated Jul. 11, 2011 for Chinese Patent Application No. 200880014987.5.

(Continued)

*Primary Examiner* — Jason M Berman
(74) *Attorney, Agent, or Firm* — Patterson & Sheridan, LLP

(57) ABSTRACT

The present invention relates to a cluster tool for processing semiconductor substrates. One embodiment of the present invention provides a mainframe for a cluster tool comprising a transfer chamber having a substrate transferring robot disposed therein. The substrate transferring robot is configured to shuttle substrates among one or more processing chambers directly or indirectly connected to the transfer chamber. The mainframe further comprises a shutter disk shelf configured to store one or more shutter disks to be used by the one or more processing chambers, wherein the shutter disk shelf is accessible to the substrate transferring robot so that the substrate transferring robot can transfer the one or more shutter disks between the shutter disk shelf and the one or more processing chambers directly or indirectly connected to the transfer chamber.

20 Claims, 30 Drawing Sheets

(56) References Cited

U.S. PATENT DOCUMENTS

| | | | |
|---|---|---|---|
| 5,788,447 A * | 8/1998 | Yonemitsu et al. | 414/217 |
| 6,066,210 A | 5/2000 | Yonemitsu et al. | |
| 6,379,095 B1 | 4/2002 | Elliott et al. | |
| 6,440,261 B1 | 8/2002 | Tepman et al. | |
| 6,589,398 B1 | 7/2003 | Lu et al. | |
| 6,669,829 B2 | 12/2003 | Feltsman et al. | |
| 6,682,295 B2 | 1/2004 | Blank et al. | |
| 7,018,517 B2 | 3/2006 | Kurita et al. | |
| 7,085,622 B2 | 8/2006 | Sadighi et al. | |
| 2001/0017192 A1 * | 8/2001 | Hwang et al. | 156/345 |
| 2001/0021486 A1 | 9/2001 | Kitano | |
| 2003/0167612 A1 | 9/2003 | Kraus et al. | |
| 2003/0202092 A1 | 10/2003 | Sadighi et al. | |
| 2004/0175961 A1 | 9/2004 | Olsen | |
| 2005/0006230 A1 * | 1/2005 | Narushima et al. | 204/298.2 |
| 2006/0153995 A1 | 7/2006 | Narwankar et al. | |
| 2006/0156979 A1 | 7/2006 | Thakur et al. | |
| 2007/0020903 A1 | 1/2007 | Takehara et al. | |
| 2007/0026547 A1 | 2/2007 | Kumar et al. | |

OTHER PUBLICATIONS

PCT International Search Report and Written Opinion dated Aug. 21, 2008 for International Application No. PCT/US2008/063111.

* cited by examiner

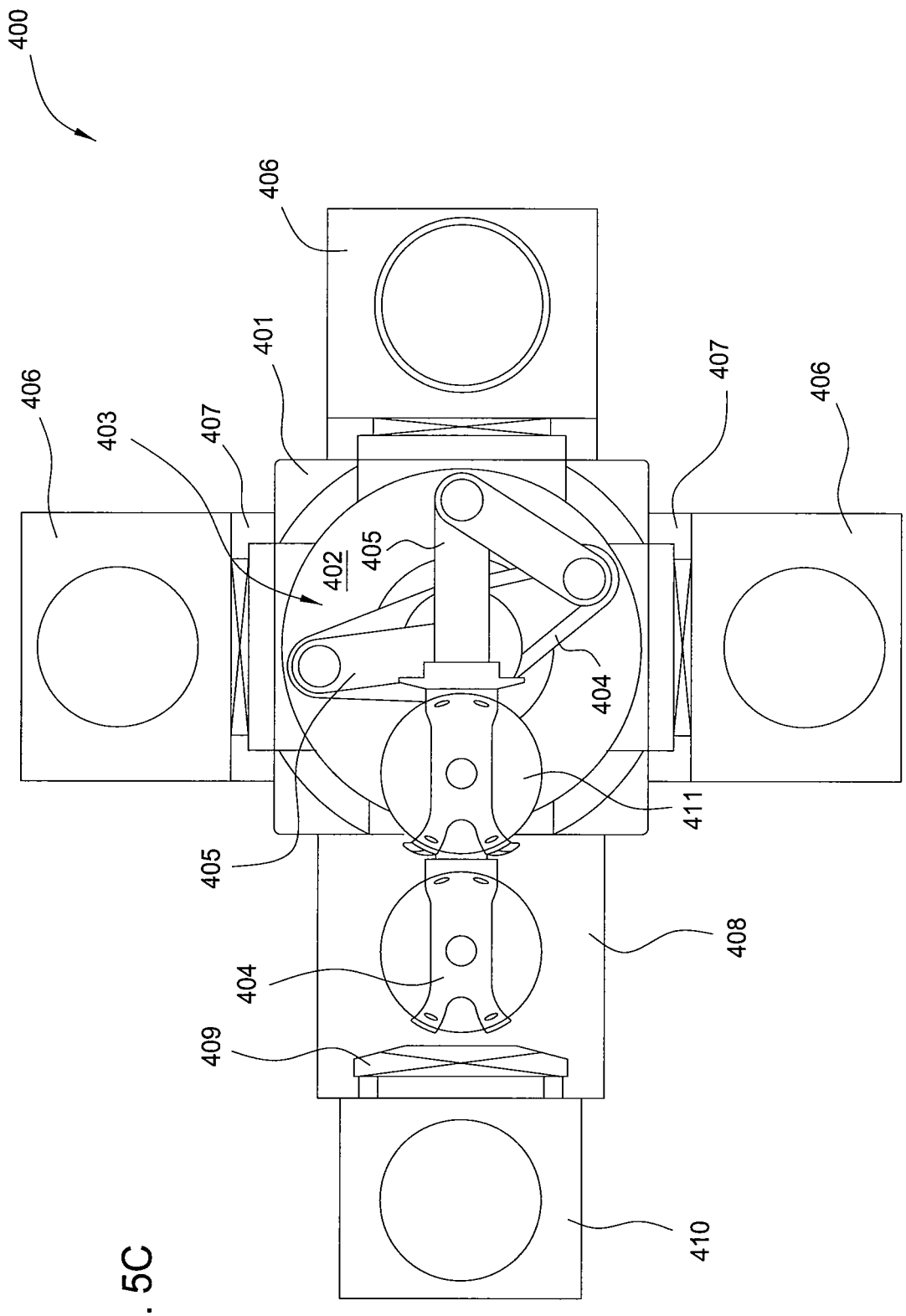

TO NEXT PAGE

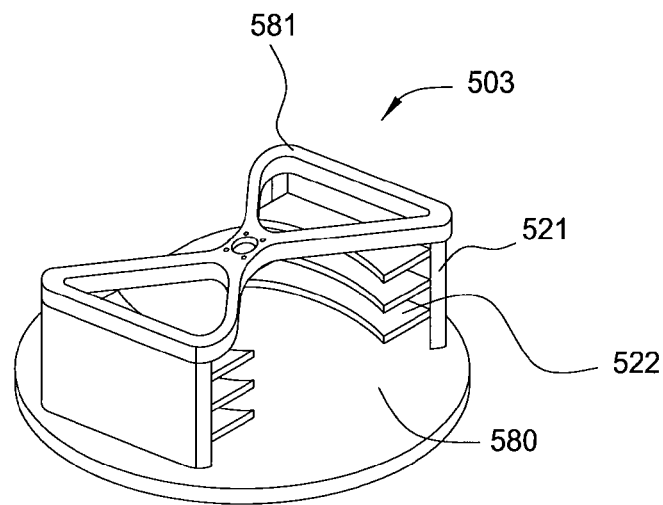
FIG 7A
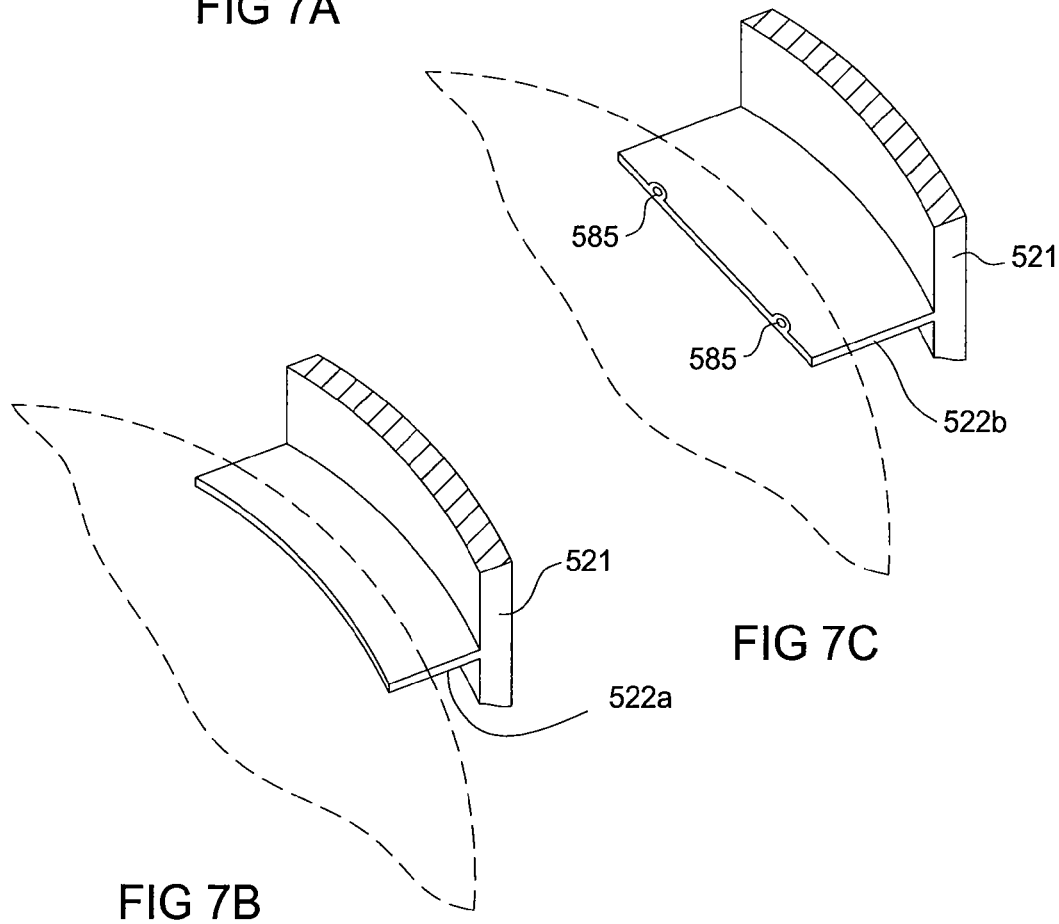
FIG 7C
FIG 7B

TRANSFER CHAMBER WITH VACUUM EXTENSION FOR SHUTTER DISKS

CROSS-REFERENCE TO RELATED APPLICATIONS

This application is a continuation of the co-pending U.S. patent application Ser. No. 12/117,945, filed May 9, 2008, which claims benefit of U.S. Provisional Patent Application Ser. No. 60/916,921, filed May 9, 2007, U.S. Provisional Patent Application Ser. No. 60/916,924, filed May 9, 2007, and U.S. Provisional Patent Application Ser. No. 60/916,932, filed May 9, 2007. Each of the aforementioned patent applications is herein incorporated by reference.

BACKGROUND OF THE INVENTION

1. Field of the Invention

Embodiments of the invention generally relate to an integrated processing system configured to process semiconductor substrates. More particularly, the invention relates a cluster tool has a mainframe including a transfer chamber and an extension chamber configured to store shutter disks therein.

2. Description of the Related Art

The process of forming semiconductor devices is commonly done in a multi-chamber processing system (e.g., a cluster tool) which has the capability to process substrates, (e.g., semiconductor wafers) in a controlled processing environment. A typical controlled processing environment includes a system that has a mainframe which houses a substrate transfer robot configured to transport substrates among a load lock chamber and multiple vacuum processing chambers, which are connected to the mainframe. The controlled processing environment has many benefits, such as minimizing contamination of the substrate surfaces during transfer and during completion of the various substrate processing steps. Processing in a controlled environment thus reduces the number of generated defects and improves device yield.

A mainframe for a cluster tool generally includes a central transfer chamber housing a robot adapted to shuttle one or more substrates. Processing chambers and load locks are mounted on the central transfer chamber. During processing, an internal volume of the central transfer chamber is typically maintained at a vacuum condition to provide an intermediate region in which substrates may be shuttled from one processing chamber to another, and/or to a load lock chamber positioned at a front end of the cluster tool.

Some processing chambers, such as a physical vapor deposition (PVD) chamber, comprise a shutter disk which may be used to protect a substrate support during conditioning operation. Typically, a PVD processing is performed in a sealed chamber having a pedestal for supporting a substrate disposed thereon. The pedestal typically includes a substrate support that has electrodes disposed therein to electrostatically hold the substrate against the substrate support during processing. A target, generally comprised of a material to be deposited on the substrate, is supported above the substrate, typically fastened to a top of the chamber. A plasma formed from a gas, such as argon, is supplied between the substrate and the target. The target is biased, causing ions within the plasma to be accelerated toward the target. Ions impacting the target cause material to become dislodged from the target. The dislodged material is attracted towards the substrate and deposit a film of material thereon.

Conditioning operations, such as burn-in process, pasting, and/or cleaning operations, are performed periodically to ensure processing performance of the PVD chamber. During conditioning operations, a dummy substrate or a shutter disk is disposed on the pedestal to protect the substrate support from any deposition or particle contamination. The state of the art PVD chambers generally include a shutter disk storage space designated storing a shutter disk during process, and a robotic arm configured to transfer the shutter disk between the shutter disk storage space and the substrate support for conditioning operations. The shutter disk stays in the shutter disk storage space within the PVD chamber during deposition, and covers the substrate support during conditioning operations. The shutter disk storage space and the robotic arm designed to transfer the shutter disk increases complexity and volume of the PVD chamber.

FIG. 1A schematically illustrates a PVD processing chamber 10 of prior art. The PVD processing chamber 10 includes a chamber body 2 and a lid assembly 6 that defines an evacuable process volume. The chamber body 2 generally includes sidewalls and a bottom 54. The sidewalls generally contain a plurality of apertures that include an access port, pumping port and a shutter disk port 56 (access and pumping ports not shown). The sealable access port provides for entrance and egress of the substrate 12 from the PVD processing chamber 10. The pumping port is coupled to a pumping system (also not shown) that evacuates and controls the pressure within the process volume. The shutter disk port 56 is configured to allow at least a portion of a shutter disk 14 therethrough when the shutter disk 14 is in the cleared position. A housing 16 generally covers the shutter disk port 56 to maintain the integrity of the vacuum within the process volume.

The lid assembly 6 of the body 2 generally supports an annular shield 62 suspended therefrom that supports a shadow ring 58. The shadow ring 58 is generally configured to confine deposition to a portion of the substrate 12 exposed through the center of the shadow ring 58.

The lid assembly 6 further includes a target 64 and a magnetron 66. The target 64 provides material that is deposited on the substrate 12 during the PVD process while the magnetron 66 enhances uniform consumption of the target material during processing. The target 64 and substrate support 4 are biased relative each other by a power source 84. A gas such as argon is supplied to the process volume 60 from a gas source 82. A plasma is formed between the substrate 12 and the target 64 from the gas. Ions within the plasma are accelerated toward the target 64 and cause material to become dislodged from the target 64. The dislodged target material is attracted towards the substrate 12 and deposits a film of material thereon.

The substrate support 4 is generally disposed on the bottom 54 of the chamber body 2 and supports the substrate 12 during processing. A shutter disk mechanism 8 is generally disposed proximate the substrate support 4. The shutter disk mechanism 8 generally includes a blade 18 that supports the shutter disk 14 and an actuator 26 coupled to the blade 18 by a shaft 20. Typically, the blade 18 is moved between the cleared position shown in FIG. 1A and a second position that places the shutter disk 114 substantially concentric with the substrate support 4. In the second position, the shutter disk 14 may be transferred (by utilizing the lift pins) to the substrate support 4 during the target burn-in and chamber pasting process. Typically, the blade 18 is returned to the cleared position during the target burn-in and chamber pasting process. The actuator 26 may be any device that may be adapted to rotate the shaft 20 through an angle that moves the blade 18 between the cleared and second positions.

FIG. 1B schematically top and sectional plan views of the PVD processing chamber. FIG. 1B illustrates the housing 16 relative to the shutter disk 14, the blade 18 and the substrate support 4.

Therefore, the state of the art PVD processing chambers with built-in shutter disk storage and transfer mechanism are not only complex but also bulky. There are usually multiple processing chambers require a shutter disk in a cluster tool configured to perform one or more PVD process steps. With multiple chambers having shutter disk storage and transferring mechanisms, footprint and cost of a cluster tool can be increased greatly.

Therefore, there is need for an efficient shutter disk storage and transferring mechanism in a cluster tool.

SUMMARY OF THE INVENTION

The present invention generally provides an apparatus and method for processing semiconductor substrates. Particularly, the present invention provides a cluster tool having an extension chamber connected to a transfer chamber, wherein the extension chamber comprises a shutter disk shelf to store shutter disks to be used in processing chambers connected to the transfer chamber.

One embodiment of the present invention provides a mainframe for a cluster tool comprising a transfer chamber having a substrate transferring robot disposed therein, wherein the substrate transferring robot is configured to shuttle substrates among one or more processing chambers directly or indirectly connected to the transfer chamber, and a shutter disk shelf configured to store one or more shutter disks to be used by the one or more processing chambers, wherein the shutter disk shelf is accessible to the substrate transferring robot so that the substrate transferring robot can transfer the one or more shutter disks between the shutter disk shelf and the one or more processing chambers directly or indirectly connected to the transfer chamber.

Another embodiment of the present invention provides a transfer chamber assembly for a cluster tool comprising a main chamber having a central robot disposed therein, wherein the main chamber configured to connect to a plurality of chambers, the central robot is configured to shuttle one or more substrates among the plurality of chambers connected to the main chamber, an extension chamber connected to the main chamber, a shutter disk shelf disposed in the extension chamber, wherein the shutter disk shelf is configured to support one or more shutter disks therein, and the shutter disk shelf is accessible to the central robot.

Yet another embodiment of the present invention provides a cluster tool configured to process semiconductor substrates comprising a first transfer chamber having a first central robot disposed therein, a first extension chamber connected to the first transfer chamber, the first extension chamber having a first shutter disk shelf positioned therein, wherein the first shutter disk shelf is configured to support one or more shutter disks thereon, and the first shutter disk shelf is accessible by the first central robot, one or more processing chambers connected to the first transfer chamber, and a load lock chamber connected to the first extension chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5C schematically illustrates a plan view of the cluster tool of FIG. 5A wherein a central robot in a transfer chamber is accessing a vacuum extension connected to the transfer chamber.

FIG. 7A schematically illustrates an isometric view of the movable shelf of FIG. 6A.

FIG. 7B schematically illustrates a supporting finger in accordance with one embodiment of the present invention.

FIG. 7C schematically illustrates a supporting finger in accordance with another embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides an apparatus and method for processing substrates using a multi-chamber processing system. Embodiments of the present invention include a mainframe comprising a transfer chamber configured to host a substrate transferring robot and an extension chamber configured to provide a low pressure environment to the mainframe. Extension chambers in accordance with embodiments of the present invention also comprise a shelf for storing and support shutter disks used by processing chambers connected to the mainframe.

Figure 1A:
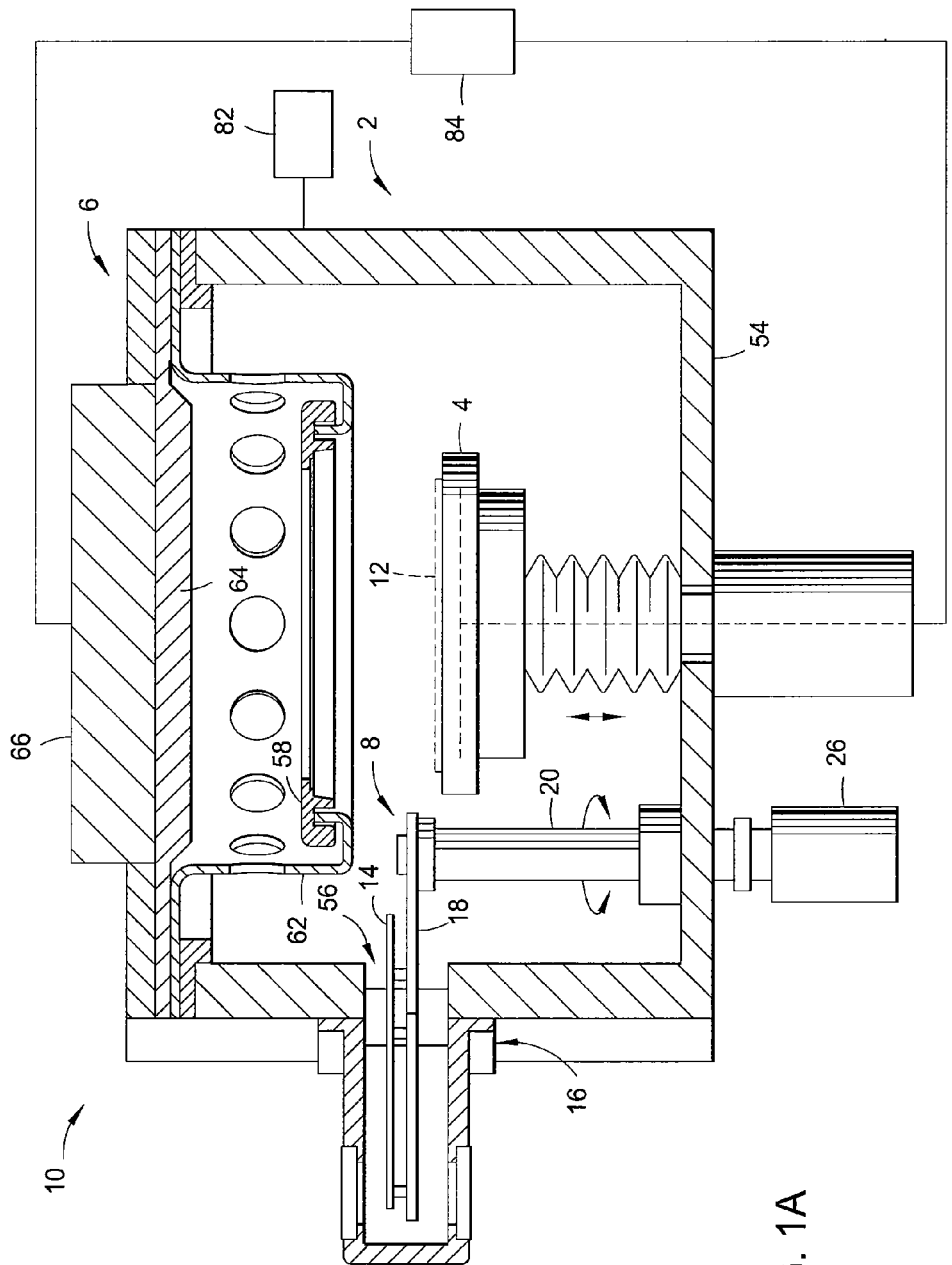
FIG. 1A schematically illustrates a sectional side view of a PVD processing chamber of prior art.
Figure 1B:
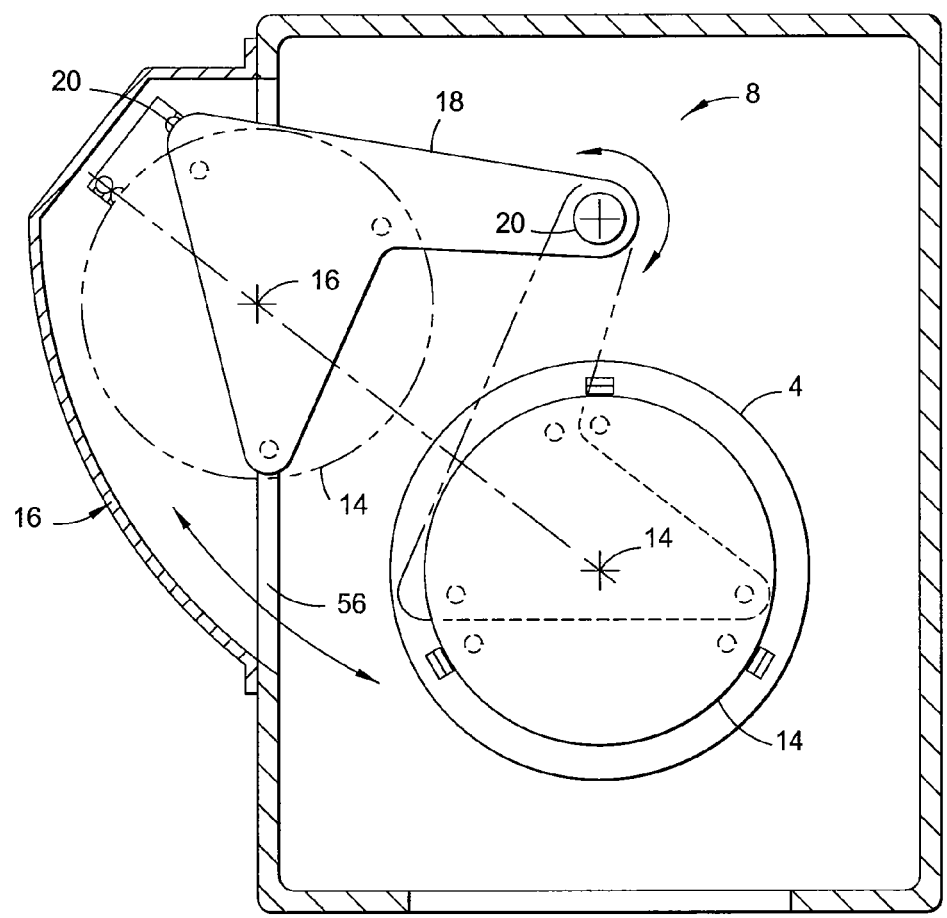
FIG. 1B schematically illustrates a top view of the PVD processing chamber of prior art.
Figure 2:
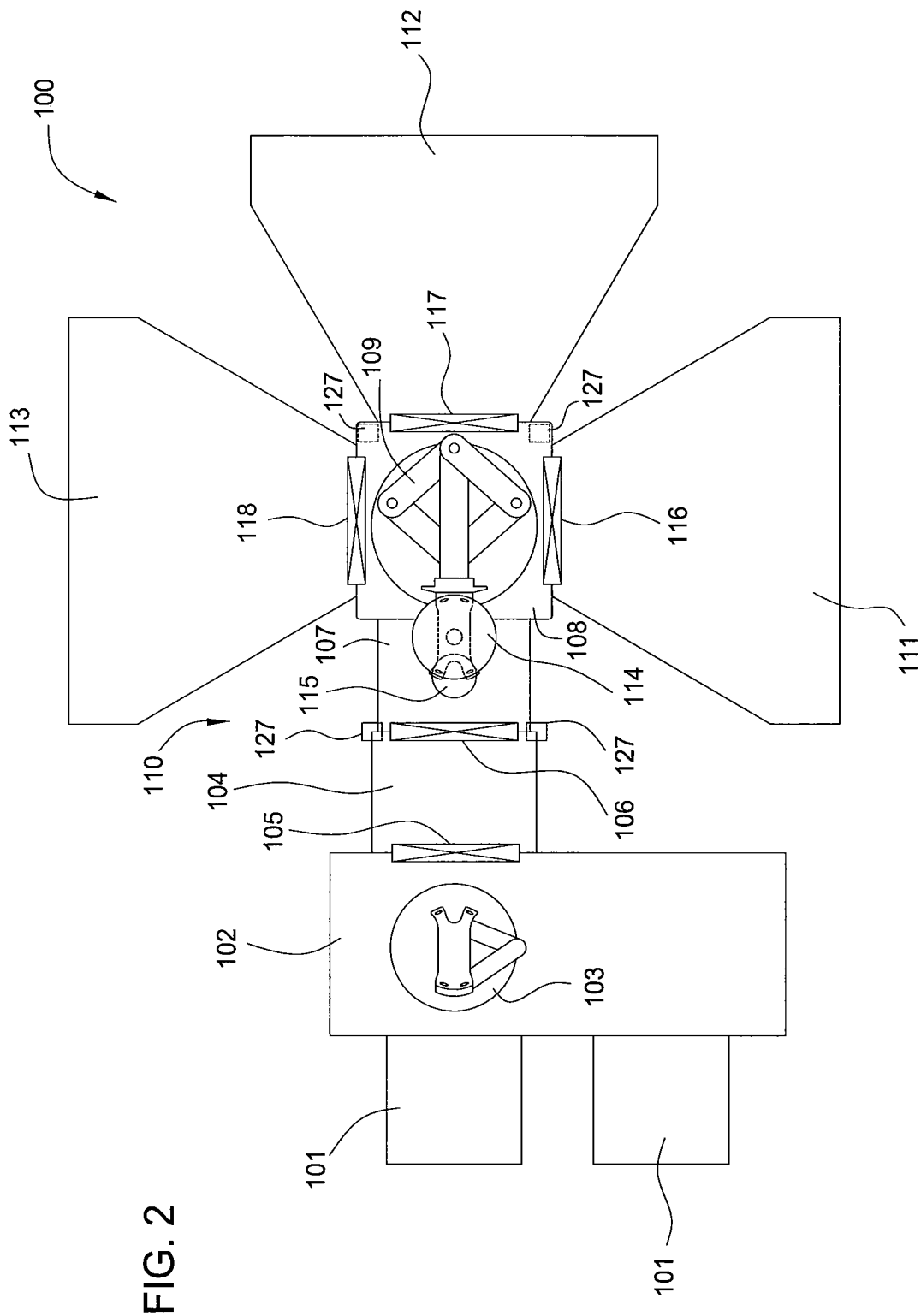
FIG. 2 schematically illustrates a plan view of a cluster tool in accordance with one embodiment of the present invention.

FIG. 2 schematically illustrates a plan view of a cluster tool 100 in accordance with one embodiment of the present invention. The cluster tool 100 comprises multiple processing chambers coupled to a single mainframe.

The cluster tool 100 comprises a front-end environment 102 (also referred to as a factory interface, or FI) in selective communication with a load lock chamber 104. One or more pods 101 are coupled to the front-end environment 102. The one or more pods 101 are configured to store and transport substrates. A factory interface robot 103 is disposed in the front-end environment 102. The factory interface robot 103 is configured to transfer substrates between the pods 101 and the load lock chamber 104.

The load lock chamber 104 provides a vacuum interface between the front-end environment 102 and a mainframe 110. An internal region of the mainframe 110 is typically maintained at a vacuum condition and provides an intermediate region to shuttle substrates from one chamber to another and/or to a load lock chamber.

In one embodiment, the mainframe 110 is divided into two parts to minimize the footprint of the cluster tool 100. In one embodiment of the present invention, the mainframe 110 comprises a transfer chamber 108 and a vacuum extension chamber 107. The transfer chamber 108 and the vacuum extension chamber 107 are coupled together and in fluid communication with one another and form an inner volume in the mainframe 110. An inner volume of the mainframe 110 is typically maintained a low pressure or vacuum condition during processing. The load lock chamber 104 may be connected to the front-end environment 102 and the vacuum extension chamber 107 via slit valves 105 and 106 respectively.

The transfer chamber 108 is configured to house a central robot 109 and provide interfaces to a plurality of processing chambers, and/or pass through chambers for connecting to additional mainframes to extend the cluster tool 100. In one embodiment, the transfer chamber 108 may be a polygonal structure having a plurality of sidewalls, a bottom and a lid. The plurality sidewalls may have opening formed therein and are configured to connect with processing chambers, vacuum extension chambers and/or pass through chambers. The transfer chamber 108 shown in FIG. 2 has a square horizontal profile and is coupled to processing chambers 111, 112, 113, and the vacuum extension chamber 107. In one embodiment, the transfer chamber 108 may be in selective communication with the processing chambers 111, 112, 113 via slit valves 116, 117, 118 respectively. In one embodiment, the central robot 109 may be mounted in the transfer chamber 108 at a robot port formed on the bottom of the transfer chamber 108.

The central robot 109 is disposed in an internal volume of the transfer chamber 108 and is configured to shuttle substrates 114 in a substantially horizontal orientation among the processing chambers 111, 112, 113 and to and from the load lock chamber 104 through the vacuum extension chamber 107. Details of suitable robots may be found in commonly assigned U.S. Pat. No. 5,469,035, entitled "Two-axis magnetically coupled robot", filed on Aug. 30, 1994; U.S. Pat. No. 5,447,409, entitled "Robot Assembly" filed on Apr. 11, 1994; and U.S. Pat. No. 6,379,095, entitled "Robot for Handling Semiconductor Substrates", filed on Apr. 14, 2000, which are hereby incorporated by reference in their entireties. In one embodiment, the central robot 109 may comprise two blades for holding substrates, each blade mounted on an independently controllable robot arm coupled to the same robot base. In another embodiment, the central robot 109 is configured to control the vertical elevation of the blades.

The vacuum extension chamber 107 is configured to provide an interface to a vacuum system to the transfer chamber 108. In one embodiment, the vacuum extension chamber 107 comprises a bottom, a lid and sidewalls. A pressure modification port 115 may be formed on the bottom of the vacuum extension chamber 107 and is configured to adapt to a vacuuming pump system, such as a cryogenic pump, which is required to maintain high vacuum in the transfer chamber 108. The pressure modification port 115 may be blocked with a blank off when only a smaller vacuum pump is needed. A smaller vacuum pump may be coupled to the transfer chamber 108 through a smaller port formed in on the transfer chamber 108.

It should be noted that the vacuum extension chamber 107 is much smaller/narrower compared to the transfer chamber 108 since the vacuum extension chamber 107 only needs to be wide enough to allow a substrate pass through.

Openings may be formed on the sidewalls so that the vacuum extension chamber 107 is in fluid communication with the transfer chamber 108, and in selective communication with chambers connected thereon, such as load lock chambers, pass through chambers, and/or processing chamber.

In one embodiment, the cluster tool 100 may be configured to deposit a film on semiconductor substrates using physical vapor deposition (PVD) process.

Typically, PVD is performed in a sealed chamber having a pedestal for supporting a substrate disposed thereon. The pedestal typically includes a substrate support that has electrodes disposed therein to electrostatically hold the substrate against the substrate support during processing. A target, generally comprised of a material to be deposited on the substrate, is supported above the substrate, typically fastened to a top of the chamber. A plasma formed from a gas, such as argon, is supplied between the substrate and the target. The target is biased, causing ions within the plasma to be accelerated toward the target. Ions impacting the target cause material to become dislodged from the target. The dislodged material is attracted towards the substrate and deposit a film of material thereon.

Conditioning operations, such as burn-in process, pasting, and/or cleaning operations, are performed periodically to ensure processing performance of the PVD chamber. During conditioning operations, a dummy substrate or a shutter disk is disposed on the pedestal to protect the substrate support from any deposition or particle contamination. The state of the art PVD chambers generally include an integral shutter disk storage space designated storing a shutter disk during the PVD process, and a robotic arm configured to transfer the shutter disk between the shutter disk storage space and the substrate support for conditioning operations. The shutter disk stays in the shutter disk storage space within the PVD chamber during deposition, and covers the substrate support during conditioning operations. The shutter disk storage space and the robotic arm designed to transfer the shutter disk increases complexity and volume of the PVD chamber.

Figure 3A:
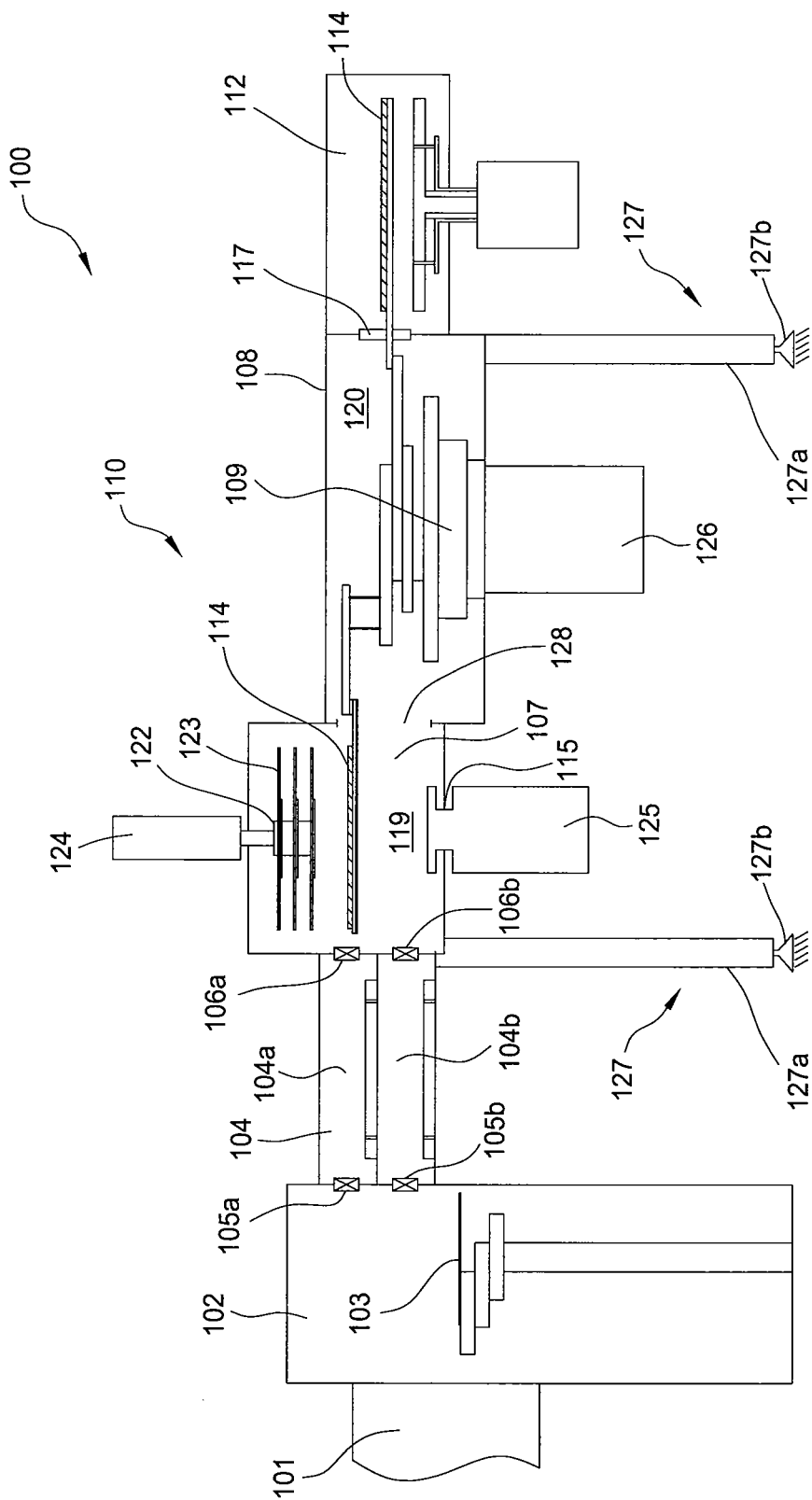
FIG. 3A schematically illustrates a sectional side view of a cluster tool having a vacuum extension with a movable shelf to store shutter disks in accordance with one embodiment of the present invention.
Figure 3B:
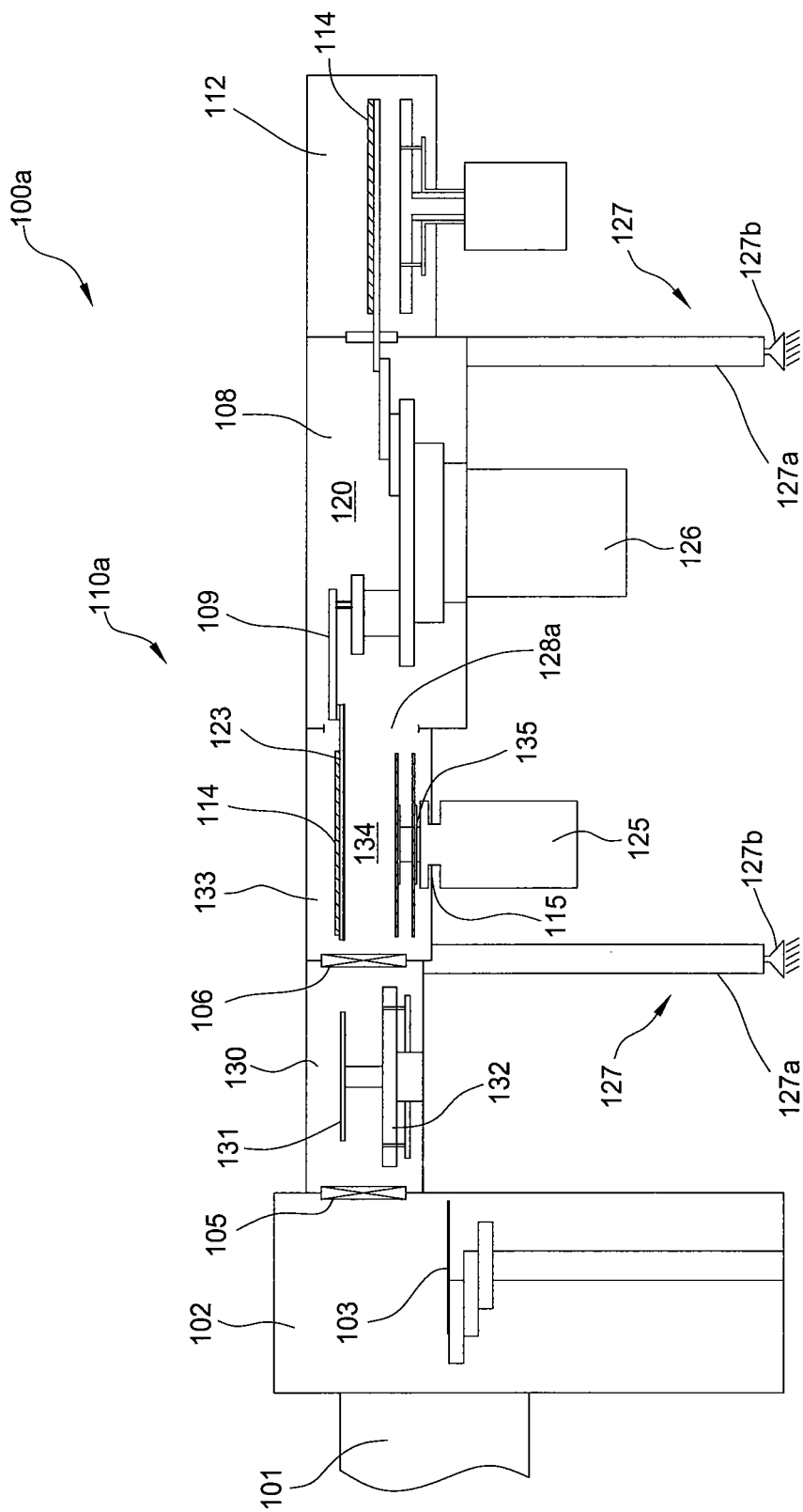
FIG. 3B schematically illustrates a sectional side view of a cluster tool having a vacuum extension with a stationary shelf to store shutter disks in accordance with one embodiment of the present invention.

In one embodiment of the present invention, the vacuum extension chamber 107 comprises a shutter disk shelf, further described in FIGS. 3A-B, configured to store one or more shutter disks. PVD chambers connected to the transfer chamber 108 may store their shutter disks in the shutter disk shelf and use the central robot 109 to transfer the shuttle disks. It is also contemplated that the PVD chambers may share one or more shutter disks. In one embodiment, the shutter disk shelf may be configured to store one shutter disk for each processing chambers connected to the transfer chamber 108.

The shutter disk shelf positioned in the vacuum extension chamber may also be used for storage, queuing, and/or accommodating any other disks used in the system. Additionally, the shutter disk shelf may be used to store and facilitate quick access to any substrate form devices, i.e. 300 mm disk, that are reusable in the system. The vacuum extension chamber of the present invention may also provide space for an inspection station, or cooling/heating station during a process.

In one embodiment, the shutter disk shelf may provide a recharging station for a vision calibration substrate. The vision calibration substrate is a reusable device having one or more wireless cameras disposed thereon. The vision calibration substrate may be used to measure, inspect and calibration interiors of a cluster tool accessible to the central robot, including the transfer chambers, extension chambers, load lock chambers, pass through chambers, and the processing chambers. The vision calibration substrate may also be used to calibrate the central robot. A detailed description of the vision calibration substrate may be found in the U.S. Pat. No. 7,085,622, entitled "Vision System", which is hereby incorporated by reference.

The vision calibration substrate comprises one or more wireless cameras, which have rechargeable power supplies so that the cameras can work wirelessly in the interior of the cluster tool. Currently, the power supplies to the wireless cameras are charged and recharged outside the cluster tool. The charged vision calibration substrate is generally fed into the cluster tool from the front-end environment while halting the process. The vision calibration substrate is taken out of the cluster tool after the task is completed or the power supplies are depleted. In one embodiment of the present invention, electrical contacts may be formed in one or more slots of the shutter disk shelf for charging a vision calibration substrate. One or more vision calibration substrates may be stored in the shutter disk shelf and are ready to use at any time. The measurement using the vision calibration substrates may be performed with much reduced interruption to the processing in the cluster tool.

Positioning shutter disks within a mainframe of a cluster tool simplifies processing chambers that require shutter disks by eliminating a designated region for shutter disks within the processing chambers, and devices for transferring and/or monitoring the shutter disks, hence reducing cost of the processing chambers. Positioning shutter disks within a mainframe of a cluster tool may also improves gas flows and electrical characteristics, and thus processing. Additionally, cost of ownership may also be reduced due to decrease of the overall volume of the cluster tool since the processing chambers are smaller.

In one embodiment, the cluster tool 100 may comprises a pre-clean chamber, a PVD chamber and a degassing chamber connected to the transferring chamber 108 at positions for processing chambers 111, 112, 113.

FIG. 3A schematically illustrates a sectional side view of the cluster tool 100 of FIG. 2. The vacuum extension chamber 107 comprises a movable shutter disk shelf 122 configured to support at least one shutter disk 123 therein.

In one embodiment of the present invention, the load lock chamber 104 comprises an upper load lock chamber 104a stacked over a lower load lock chamber 104b. The upper load lock chamber 104a and the lower load lock chamber 104b may be operated independently so that transferring of substrates between the front-end environment 102 and the mainframe 110 can be conducted in both directions simultaneously.

The load lock chambers 104a, 104b provide a first vacuum interface between the front-end environment 102 and the mainframe 110 via slit valves 105a, 106a, 105b, 106b respectively. In one embodiment, the two load lock chambers 104a, 104b are provided to increase throughput by alternatively communicating with the mainframe 110 and the front-end environment 102. While one load lock chamber 104a or 104b communicates with the mainframe 110, a second load lock chamber 104b or 104a can communicate with the front-end environment 102.

In one embodiment, one of the load lock chambers 104a, 104b may be used as a processing chamber, such as a degas chamber, an inspection station, a pre-heat chamber, a cooling chamber, or curing chamber. For example, the slit valve 105b may be replaced by a permanent blocker so that the lower load lock chamber 104b only opens to the mainframe 110. The central robot 109 may shuttle substrates to and from the lower load lock chamber 104b prior to and after a degassing process through the slit valve 106b.

Referring to FIG. 3A, the internal volume of the mainframe 110 is defined by an internal volume 119 of the vacuum extension chamber 107 connected to an internal volume 120 of the transfer chamber 108. An opening 128 is formed between the transfer chamber 108 and the vacuum extension chamber 107. The opening 128 provides fluid communication between the vacuum extension chamber 107 and the transfer chamber 108, and are large enough to allow the central robot 109 to shuttle substrates to and from the load lock chamber 104.

A vacuum system 125 is coupled the vacuum extension chamber 107 and is configured to provide a low pressure environment to both the internal volume 119 and the internal volume 120. A robotic mechanism 126 is coupled to the transfer chamber 108. The transfer chamber 108 and the vacuum extension chamber 107 are constructed to minimize the foot print of the cluster tool 100.

For a cluster tool, when a vacuum system, such as a cryogenic pump, is required to maintain vacuum, usually high vacuum, within a transfer chamber, a large vacuum port is generally formed in the transfer chamber. The transfer chamber, thus, has both a robot port configured to adapt to a robotic transport mechanism and a vacuum port for the vacuum system. The robot port is generally positioned near a center of the transfer chamber, while the vacuum port positioned in a satellite position relative to the robot port leaving enough space for both the robotic transport mechanism and the vacuum pump. As a result, the transfer chamber has a large foot print and a large internal volume. The large foot print of the transfer chamber greatly enlarges the foot print of the cluster tool as a whole since processing chambers, load lock chambers and/or pass through chambers are distributed around the transfer chamber.

Embodiments of the present invention provides a vacuum system connection to the transfer chamber for obtaining high vacuum without greatly enlarge the foot print of the transfer chamber and the cluster tool. By "outsourcing" the pressure modification port to a separated extension chamber, size of the transfer chamber may be minimized to be just enough to provide space for the central robot. Size of the extension chamber may be determined by the size of the vacuum system needed. The combined footprint of a transfer chamber with a robot port only and its extension chamber with a robot port is much smaller compared to the state of a state of the art transfer chamber with both a vacuum port and a robot port. The decrease of the foot print of a cluster tool is more pronounced since a cluster tool may be built around a minimized transfer chamber when the extension chamber is positioned to take a space of a load lock chamber around the transfer chamber.

It should be noted that the size of the extension chamber is usually much smaller than the size of the transfer chamber since the extension chamber only needs to be large enough to accommodate passage of a substrate, while the transfer chamber generally needs to host the central robot.

Additionally, internal volume of a transfer chamber and extension chamber of the present invention is reduced compared to the state of the art transfer chambers. This allows fast pump downs, requires less energy to maintain vacuum and smaller, less costly pumps.

In one embodiment, an indexer 124 is coupled to the movable shutter disk shelf 122 and is configured to vertically move the movable shutter disk shelf 122. The movable shutter disk shelf 122 may be positioned on an upper portion of the internal volume 119 of the vacuum extension chamber 107 when the central robot 109 transfers substrates to and from the load lock chamber 104 through a lower portion of the internal volume 119. The movable shutter disk shelf 122 may be lowered to the lower portion of the internal volume 119 by the indexer 124 so that the central robot 109 can pick up a shutter disk from the movable shutter disk shelf 122 or drop a shutter disk on the movable shelf 122.

FIG. 3B schematically illustrates a sectional side view of a cluster tool 100a having a mainframe 110a in accordance with one embodiment of the present invention. The mainframe 110a comprises a vacuum extension chamber 133 with a stationary shelf 135 configured for storing one or more shutter disks.

A load lock chamber 130 provides a first vacuum interface between the front-end environment 102 and the mainframe 110a. In one embodiment, the load lock chamber 130 comprises an upper substrate support 131 and a lower substrate support 132 stacked within the load lock chamber 130. The upper substrate support 131 and the lower substrate support 132 are configured to support substrates thereon. In one embodiment, the upper substrate support 131 and the lower substrate support 132 may be configured to support incoming and outgoing substrates respectively. The upper substrate support 131 and the lower substrate support 132 may comprise features for temperature control, such as a built-in heater or cooler to heat or cool substrates during transferring.

The internal volume of the mainframe 110a is defined by an internal volume 134 of the vacuum extension chamber 133 connected to the internal volume 120 of the transfer chamber 108. An opening 128a is formed between the transfer chamber 108 and the vacuum extension chamber 133. The opening 128a provides fluid communication between the vacuum extension chamber 133 and the transfer chamber 108, and are large enough to allow the central robot 109 to shuttle substrates to and from the load lock chamber 130, as well as access the stationary shelf 135 of the vacuum extension chamber 133.

In one embodiment, the stationary shelf 135 may be positioned on a lower portion of the internal volume 134 of the vacuum extension 133 while the central robot 109 is configured to transfer substrates to and from the load lock chamber 130 through an upper portion of the internal volume 134.

In one embodiment, the stationary shelf 135 may comprise supporting fingers extending from posts positioned on opposite sides of the internal volume 134.

It should be noted that the robot 109 may be suspended from a top wall of the transfer chamber 108. Embodiments of the present invention may include robots capable of vertical or z-motion.

Referring back to FIG. 3A, the mainframe 110 of the cluster tool 100 is supported by supporting legs 127. The supporting legs 127 provide vertical and lateral support to the mainframe 110 and chambers connected to the mainframe 110. Each of the supporting legs 127 is configured to support at least a portion of the weight of the mainframe 110 including the transfer chamber 108, the vacuum extension chamber 107, and optionally the processing chambers connected thereon. Each of the supporting legs 127 may be vertically adjustable so that the mainframe 110 and chambers connected thereon may be leveled on site. The supporting legs 127 are coupled to sidewalls of the mainframe 110 and/or chambers coupled to the mainframe 110 to provide lateral support to the cluster tool 100.

In one embodiment, each of the supporting legs 127 may comprise a foot 127b connected to a steel tube body 127a. The steel tube body 127a is configured to be coupled to the mainframe 110. The foot 127b is configured to contact the ground and adjustable relative to the steel tube body 127a. Vertical dimension of the supporting leg 127 may be adjusted by adjusting the foot 127b to provide tolerance in supporting the cluster tool 100.

Figure 3C:
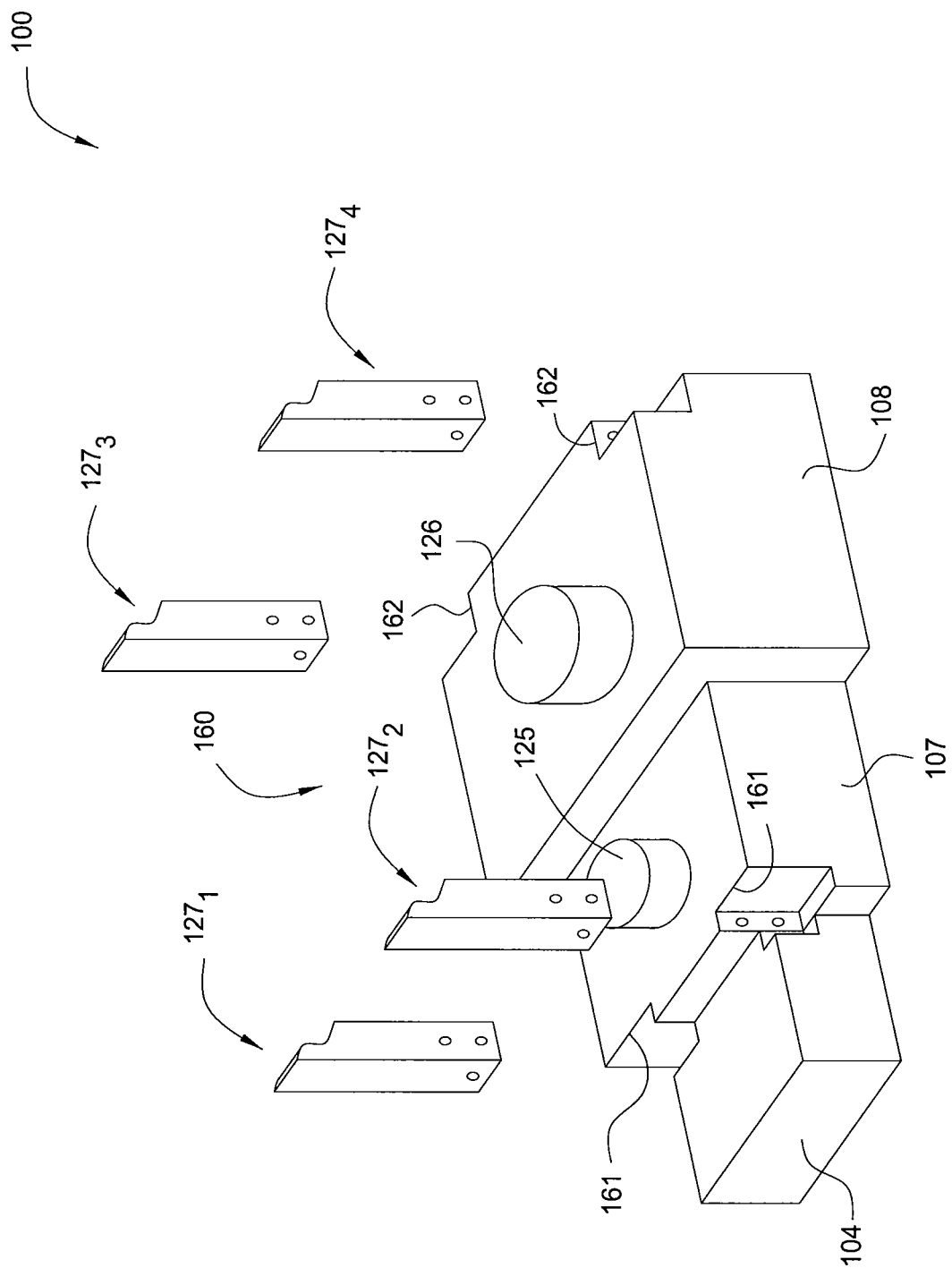
FIG. 3C schematically illustrates a partial isometric bottom view showing one embodiment of supporting legs of the cluster tool of FIG. 3A.
Figure 3D:
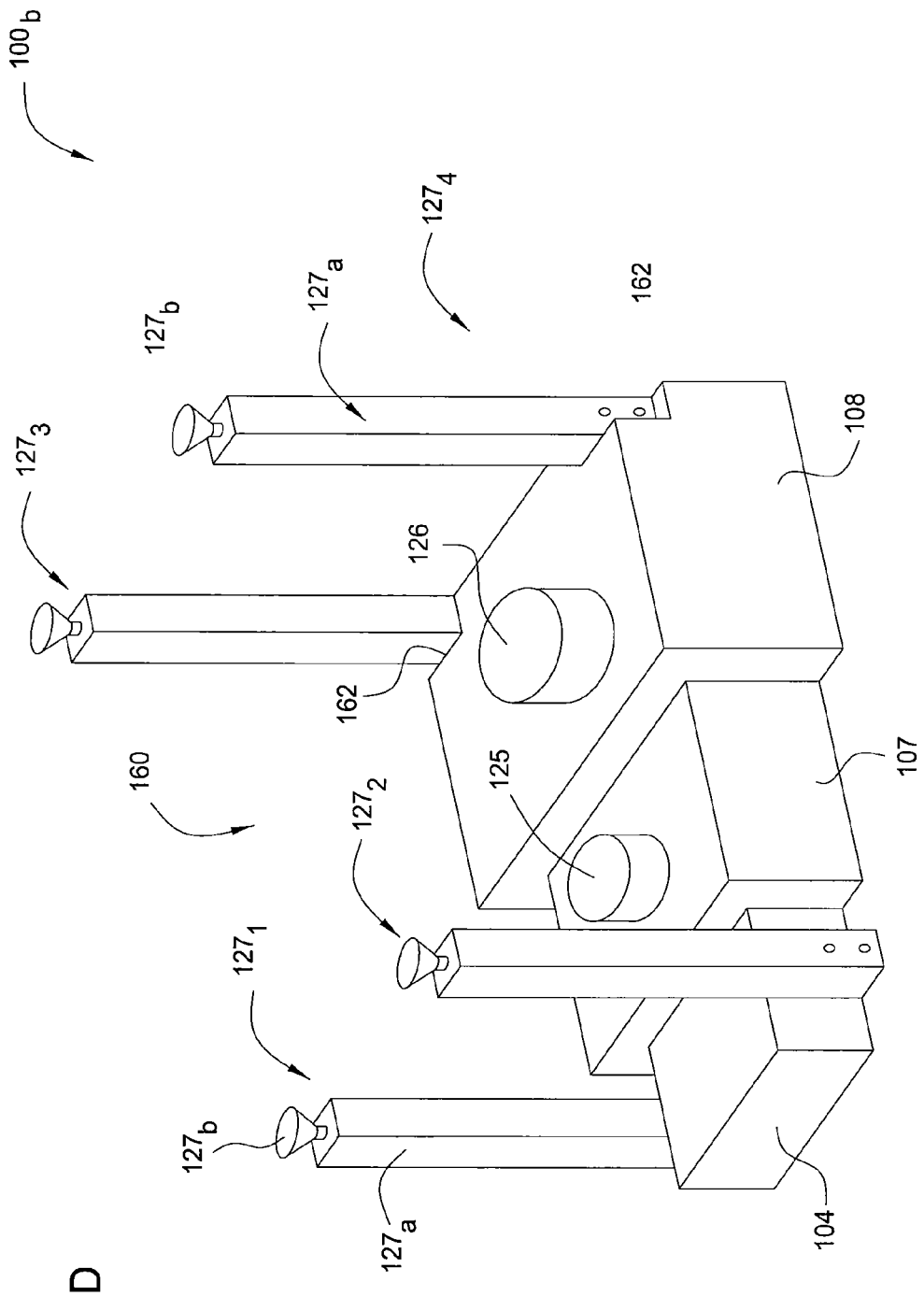
FIG. 3D schematically illustrates a partial isometric bottom view showing another embodiment of supporting legs of the cluster tool of FIG. 3A.

In one embodiment, the mainframe 110 may be supported by for supporting legs 127 independently mounted on opposite sides of the mainframe 110, as shown in FIG. 2, and FIGS. 3C-3D. Two of the supporting legs 127 are independently fastened to sidewalls of the transfer chamber 108 and two of the supporting legs 127 are independently fastened to sidewalls of the vacuum extension chamber 107. In another embodiment, two of the supporting legs 127 may be positioned near the joint region of the vacuum extension chamber 107 and the load lock chamber 104. In one embodiment, notches may be formed on sidewalls of the mainframe 110 for the supporting legs 127 to engage with.

Screws may be used to fasten each supporting leg 127 to a corresponding location in the mainframe 110. FIG. 4E illustrates screw holes 318, 319 formed in the chamber body 301 configured to secure supporting legs in the notches 309.

FIG. 3C schematically illustrates a partial isometric bottom view showing one embodiment of supporting legs of a cluster tool 100b similar to the cluster tool 100 of FIG. 3A. As shown in FIG. 3C, the cluster tool 100b is supported by four independent supporting legs 1271-4. Each of the supporting legs 1271-4 is independently mounted on the cluster tool 100. FIG. 3C shows a central structure 160, which includes the transfer chamber 108 and the vacuum extension chamber 107, and the load lock chamber 104 coupled together. Additional components, such as processing chambers, pass through chambers, and front end interface may be extended from the central structure 160. The supporting legs 1271-4 are coupled to the central structure 160 providing support to the cluster tool 100 in a whole. A pair of notches 161 may be formed in the bottom walls near a joint region of the load lock chamber 104 and the vacuum extension chamber 107. The notches 161 are configured to provide lateral support to the supporting leg 127 mounted therein. A pair of notches 162 may be formed in the transfer chamber 108 and configured to engage supporting legs 1273-4. The notches 162 also provide lateral support to the supporting legs 127 mounted therein. The notches 161, 162 may be placed in locations such that the supporting legs 1271-4 provide balanced support to the cluster tool 100, including the central structure 160 and/or chambers connected to the central structure 160.

FIG. 3D schematically illustrates a partial isometric bottom view showing another embodiment of supporting legs of the cluster tool 100 of FIG. 3A. In this embodiment, the supporting legs 1271-4 may be mounted on sidewalls of the load lock chamber 104, or the vacuum extension chamber 107.

The design of independent supporting legs has several advantages over conventional cluster tool support, which generally includes a welded base used to provide a ridged support. The conventional base is typically in an integral form and is configured to provide support to multiple components of a cluster tool. The conventional base is costly to build providing high precision demanded by the semiconductor processing. The conventional base is also difficult to assemble because it has to be coupled to multiple components of a cluster tool. The conventional base usually poses clearance issues for other components in a cluster tool causing disconnection of utility during utility routing or removal of chamber components from the base.

The independent leg supporting of the present invention largely reduces cost over conventional base. Each supporting leg is manufactured separately avoiding manufacture cost of a high precision structure. Each supporting leg is generally coupled to one component, which makes leveling and other adjustment much easier. The supporting leg is not limited to any cluster tool configuration. When one or more components, such as a load lock chamber, are altered, the supporting legs do not need to be replaced. Furthermore, the supporting leg of the present invention is much easier to transport.

Figure 4A:
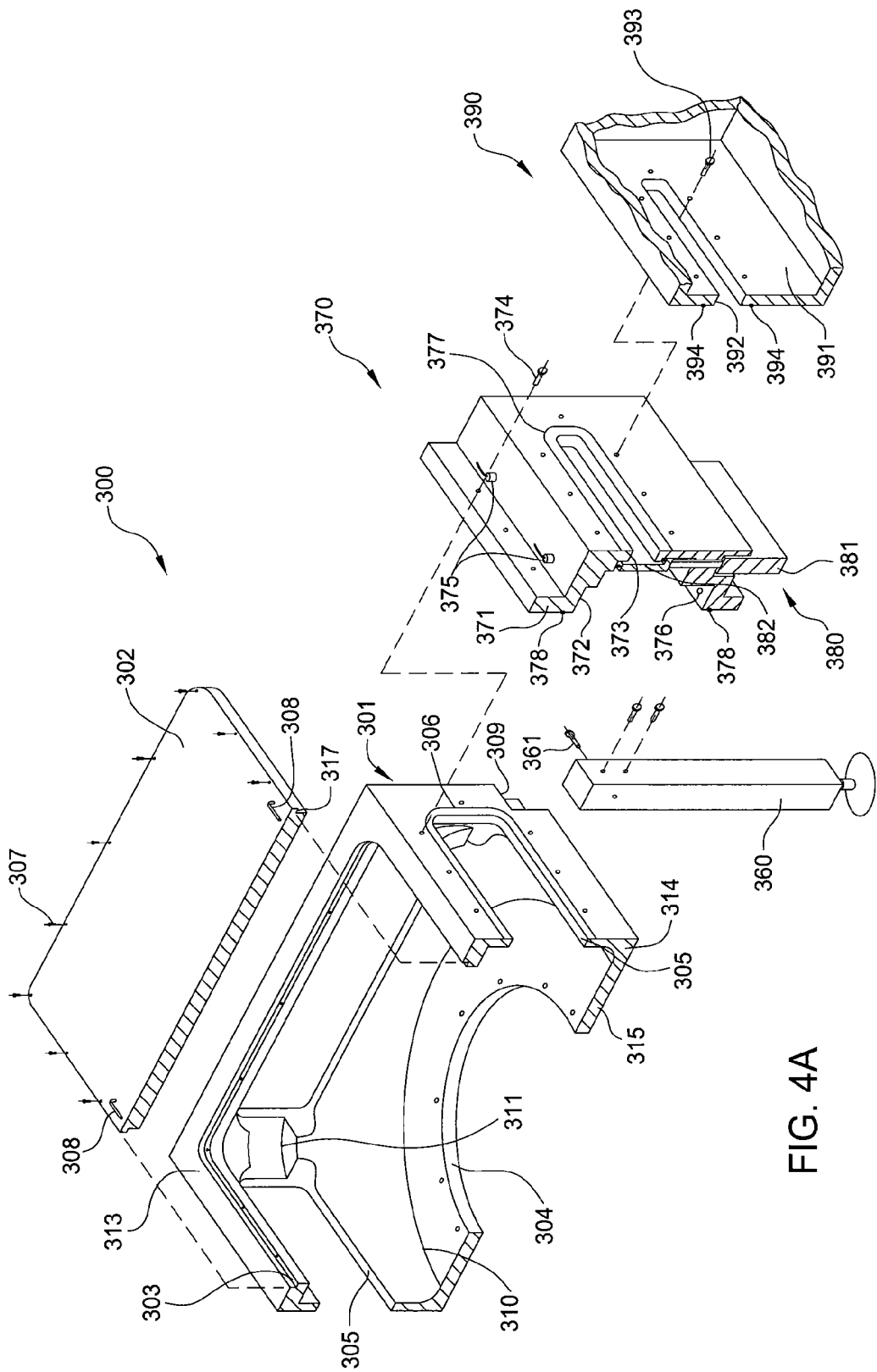
FIG. 4A schematically illustrates an isometric sectional view of a transfer chamber in accordance with one embodiment of the present invention.

FIG. 4A schematically illustrates an exploded sectional view of a transfer chamber 300 in accordance with one embodiment of the present invention. The transfer chamber 300 may be used as the transfer chamber 108 of FIG. 2, and FIGS. 3A-B. The transfer chamber 300 comprises a chamber body 301 having a top wall 313, a plurality of sidewalls 314 and a bottom wall 315. The chamber body 301 defines an inner volume 312 (shown in FIG. 4C) configured to accommodate a substrate transferring means, such as a robot, therein. In one embodiment, a central robot may be disposed in a robot port 304 formed on the bottom wall 315 of the transfer chamber 300.

The transfer chamber 300 further comprises a chamber lid 302 configured to seal an opening 303 formed on the top wall 313 of the chamber body 301. The opening 303 may be configured to assist installation and/or maintenance of the substrate transferring means. In one embodiment, the chamber lid 302 may be coupled to the chamber body 301 with a seal ring 317 and a plurality of screws 307. The chamber lid 302 may have a pair of handles 308.

In one embodiment, the chamber body 301 has a rectangular profile and comprises four sidewalls 314. Each of the sidewalls 314 has an opening 305 formed therein. The openings 305 are configured to provide selective communication between the inner volume 312 and processing chambers, load lock chambers, and/or vacuum extensions coupled to the transfer chamber 300. A gland 306 may be formed around the opening 305 and configured to accommodate a seal ring (not shown) to maintain a pressure barrier around the inner volume 312.

FIG. 4A schematically illustrates a processing chamber 390 mounted to the transfer chamber 300 via a chamber port assembly 370 in accordance with one embodiment of the present invention. The chamber port assembly 370 provides an interface between the transfer chamber 300 and the processing chamber 390. In one embodiment, the chamber port assembly 370 provides a housing for a slit valve assembly 380 configured to open and close a substrate opening 392 formed through a sidewall 391 of the processing chamber 390. The substrate opening 392 is configured to provide a passage to allow entry and egress of substrates from the processing chamber 390. Additionally, the chamber port assembly 370 allows mismatch between the opening 305 of the transfer chamber 300 and the substrate opening 392 of the processing chamber 390.

The chamber port assembly 370 comprises a body 371 having a transfer chamber opening 372 open towards one side of the body 371. The transfer chamber opening 372 is configured to cover the opening 305 of the transfer chamber 300. The transfer chamber opening 372 is connected to a chamber opening 373 which opens on an opposite side of the body 371 to define a substrate passage through the chamber port assembly 370. The chamber opening 373 is configured to align with the substrate opening 392 of the processing chamber 390. A gland 377 may be formed on an outer side of the substrate opening 392 to accommodate a seal ring (not shown) to prevent leakage between the chamber port assembly 370 and the processing chamber 390.

The slit valve assembly 380 generally comprises a slit valve door 382 activated by an activation member 381 configured to move the slit valve door 382 between an opening position and a closed position. The slit valve door 382 of the slit valve assembly 380 may be positioned on an inner side of the chamber opening 373 and selectively connects and disconnects the transfer chamber opening 372 and the chamber opening 373, hence, selectively connecting the transfer chamber 300 and the processing chamber 390.

In one embodiment, a plurality of screws 374 may be used to fasten the chamber port assembly 370 to the transfer chamber 300. In one embodiment, a seal ring 378 may be used in the gland 306 circumscribing the opening 305 between the transfer chamber 300 and the chamber port assembly 370 to fluidly isolate the inner region of the chamber port assembly 370 and the transfer chamber 300 from an outside environment. A plurality of screws 393 and a seal ring 394 may be used to mount the processing chamber 390 to the chamber port assembly 370.

Figure 4B:
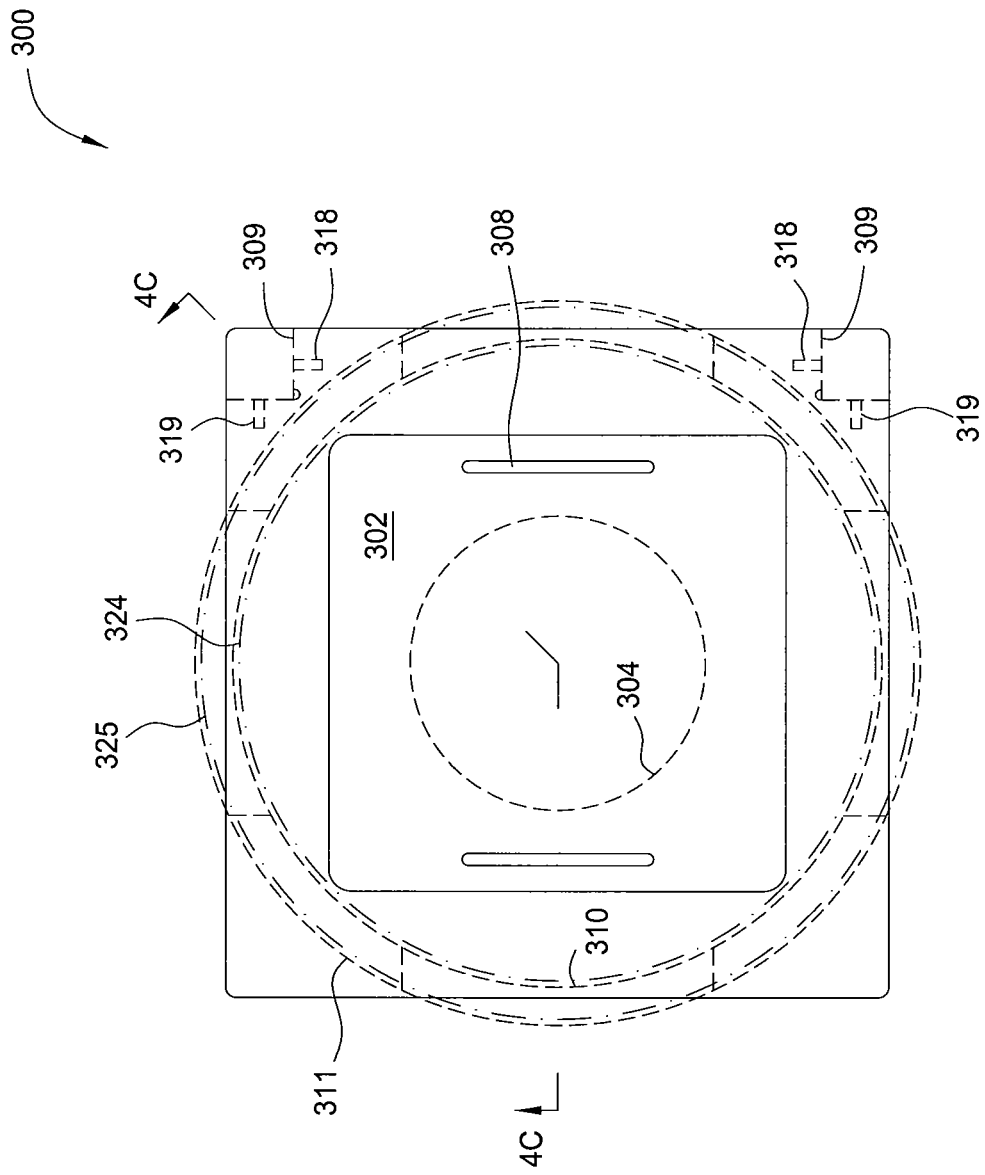
FIG. 4B schematically illustrates a top view of the transfer chamber of FIG. 4A.

Additionally, the transfer chamber opening 372 may provide a pocket of extra room that accommodates the tip of a robot positioned in the transfer chamber 300 as the blade is rotated in a horizontal plane (further described with FIG. 4B). The pocket of extra room in the chamber port assembly 370 allows further reducing in size of the transfer chamber 300, hence reducing foot print of the system. In one embodiment, the chamber port assembly 370 may comprise one or more sensors configured to detect substrate and/or robot parts within the transfer chamber opening 372. FIG. 4A schematically shows optical sources 376 and optical receivers 375 used as sensors to detect substrates and/or robot parts.

It should be noted that a load lock chamber may be coupled to one of the sidewall 314 of the transfer chamber 300 directly or via a chamber port assembly similarly to the chamber port assembly 370.

In one embodiment, two notches 309 may be formed near corners of the bottom wall 315. Each of the notches 309 is configured to receive a supporting leg 360 therein. Each of the supporting legs 306 is configured to bear at least part of the weight of the transfer chamber 300 and devices mounted thereto. The supporting leg 360 may be fastened against the transfer chamber 300 by screws 361. The notch 309 provides two planes for lateral support for the supporting leg 360.

Figure 4C:
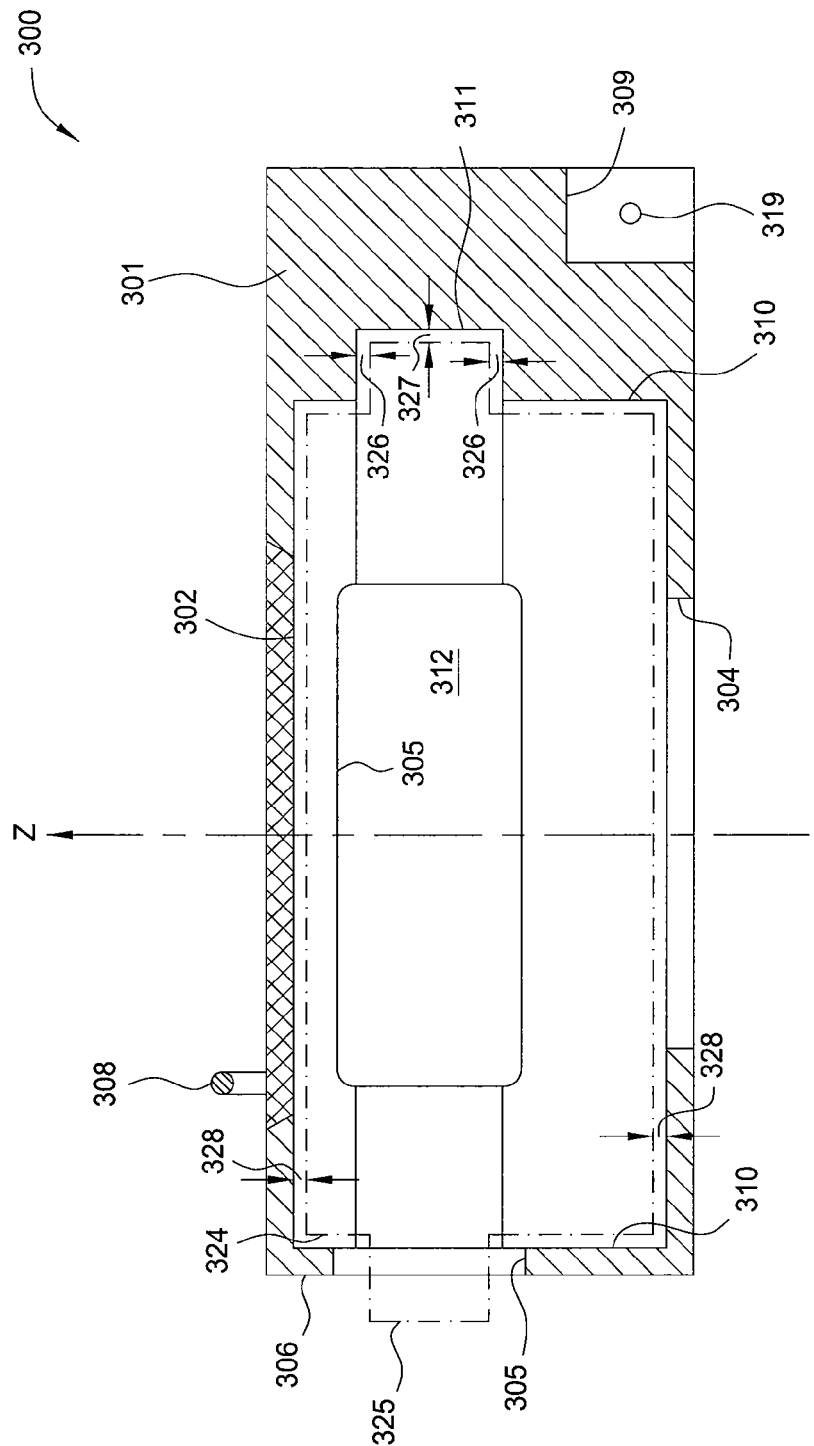
FIG. 4C schematically illustrates a sectional side view of the transfer chamber of FIG. 4A.

FIG. 4B schematically illustrates a plan view of the transfer chamber 300 of FIG. 4A. FIG. 4C schematically illustrates a sectional side view of the transfer chamber 300 of FIG. 4A. Referring to FIG. 4C, the chamber body 301 may be formed by cast aluminum and defining the inner volume 312 configured to provide space for movement of a central robot position therein. In one embodiment, the inner volume 312 may be minimized to be just large enough to accommodate required movement of a robot disposed therein.

FIG. 4E schematically illustrates an isometric sectional view of the transfer chamber 300 of FIG. 4A with a central robot 316 in a rotation mode. The central robot 316 comprises a top blade 329 and a bottom blade 330, each configured to transfer a substrate 331 independently. The central robot 316 is capable of rotating about z axis, translating along the z axis, and translating parallel to x-y plane. Other suitable robots may be used in the transfer chamber 300. The central robot 316 may be suspended from the top wall 313 of the transfer chamber 300 as well with corresponding changes of other structures.

During processing, the central robot 316 may extend the top blade 329 or the bottom blade 330 through one of the openings 305 on the sidewalls 314 of the transfer chamber 300 to retrieve a substrate in a processing chamber/load lock chamber connected to the transfer chamber 300, or a shutter disk stored in a vacuum extension chamber connected to the transfer chamber 300. The central robot 316 may need to translate vertically, i.e. along z axis, so that the top blade 329 or the bottom blade 330 is aligned with the target substrate or shutter disk. Upon picking up the substrate/shutter disk, the central robot 316 retrieves the top blade 329 or the bottom blade 330 back to the inner volume 312 of the transfer chamber 300, and rotates the top blade 329 or the bottom blade 330 within the inner volume 312 so that the top blade 329 or the bottom blade 330 is align with an opening 305 connecting a target chamber for the substrate/shutter disk. The central robot 316 then extends the top blade 329 or the bottom blade 330 to access the target chamber and drops the substrate/shutter disk therein.

It is desirable to minimize the inner volume 312 of the transfer chamber 300 to reduce system foot print and to reduce volume of the controlled environment. In one embodiment, the inner volume 312 of the transfer chamber 300 is defined to match a motion envelop described by circles 324 and 325, shown in FIGS. 4B and 4C, necessary for the central robot 316 to perform required functions. The motion envelop of cylindrical with a large center portion having a radius of the circle 325, and small upper and lower portions having a radius of the circle 324. The large center portion of the motion envelop is partially accommodated by a large middle portion with a radius of 311 in the inner volume 312 and extra room in the chamber port assembly 370 and the vacuum extension chamber 350 connected to the transfer chamber 300.

In one embodiment, the motion envelop includes space needed for the central robot 316 to perform rotation and required vertical movement therein. The motion envelop has a substantially cylindrical shape with an enlarged middle portion marked by circle 325 configured to allow tips of the blades 329, 330 during rotation. Accordingly, the inner volume 312 is substantially cylindrical with a radius marked by line 310 and an enlarged middle portion having a radius marked by line 311. To further reduce size of the transfer chamber 300, part of the enlarged middle portion 325 may be outside the transfer chamber 300 and extends to a vacuum extension chamber and/or chamber port assemblies 370 connected to the transfer chamber 300, for example, to the transfer chamber opening 372 of the chamber port assembly 370.

In one embodiment, a radial clearance 327, shown in FIG. 4C, between the inner volume 312 and the motion envelop may be about 0.25 inch and the vertical clearances 326, 328 may be about 0.338 inch.

In one embodiment, software constraints may be used in a control system so that the central robot 316 stays within the motion envelop.

Figure 4D:
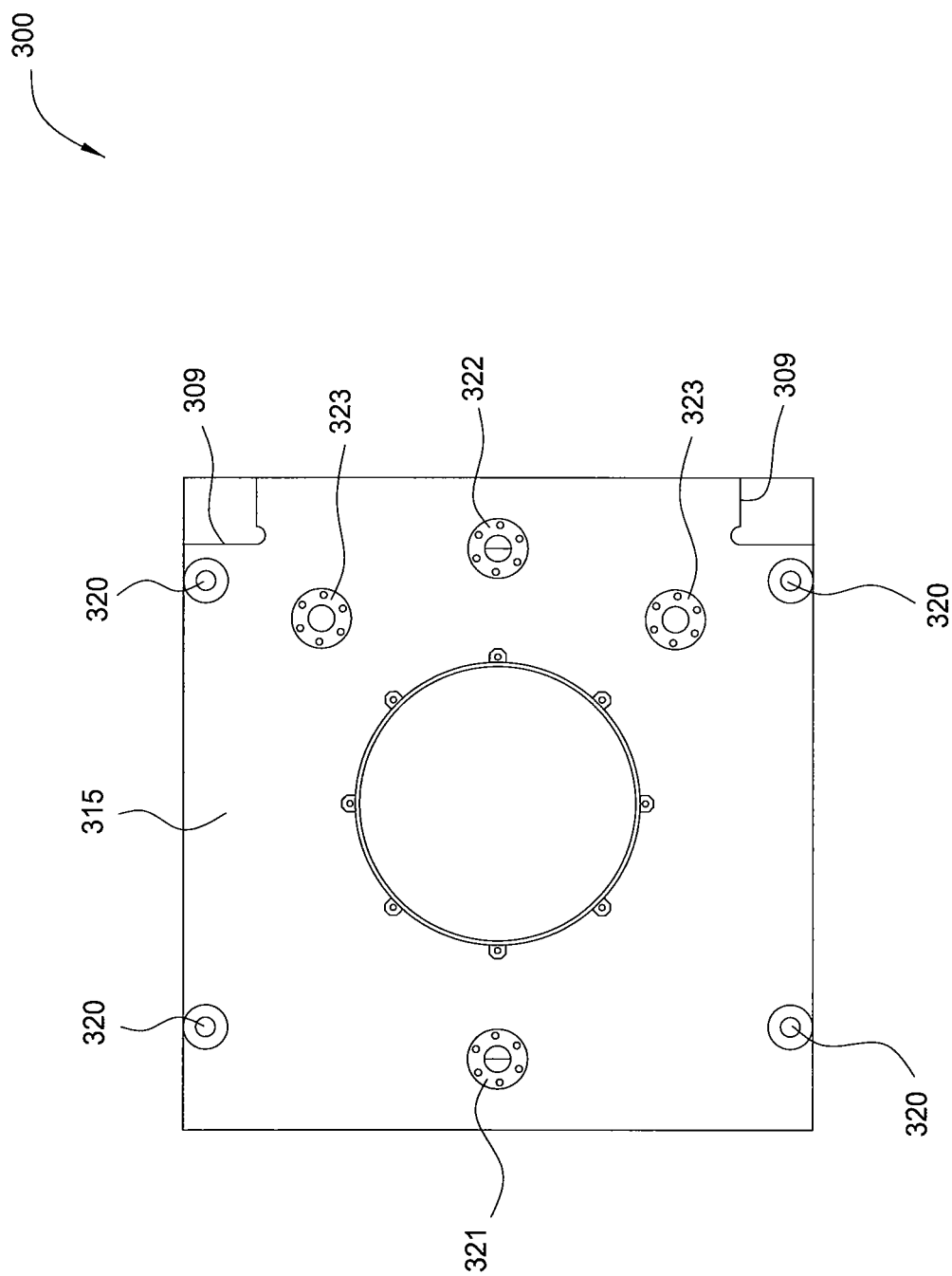
FIG. 4D schematically illustrates a bottom view of the transfer chamber of FIG. 4A.
Figure 4E:
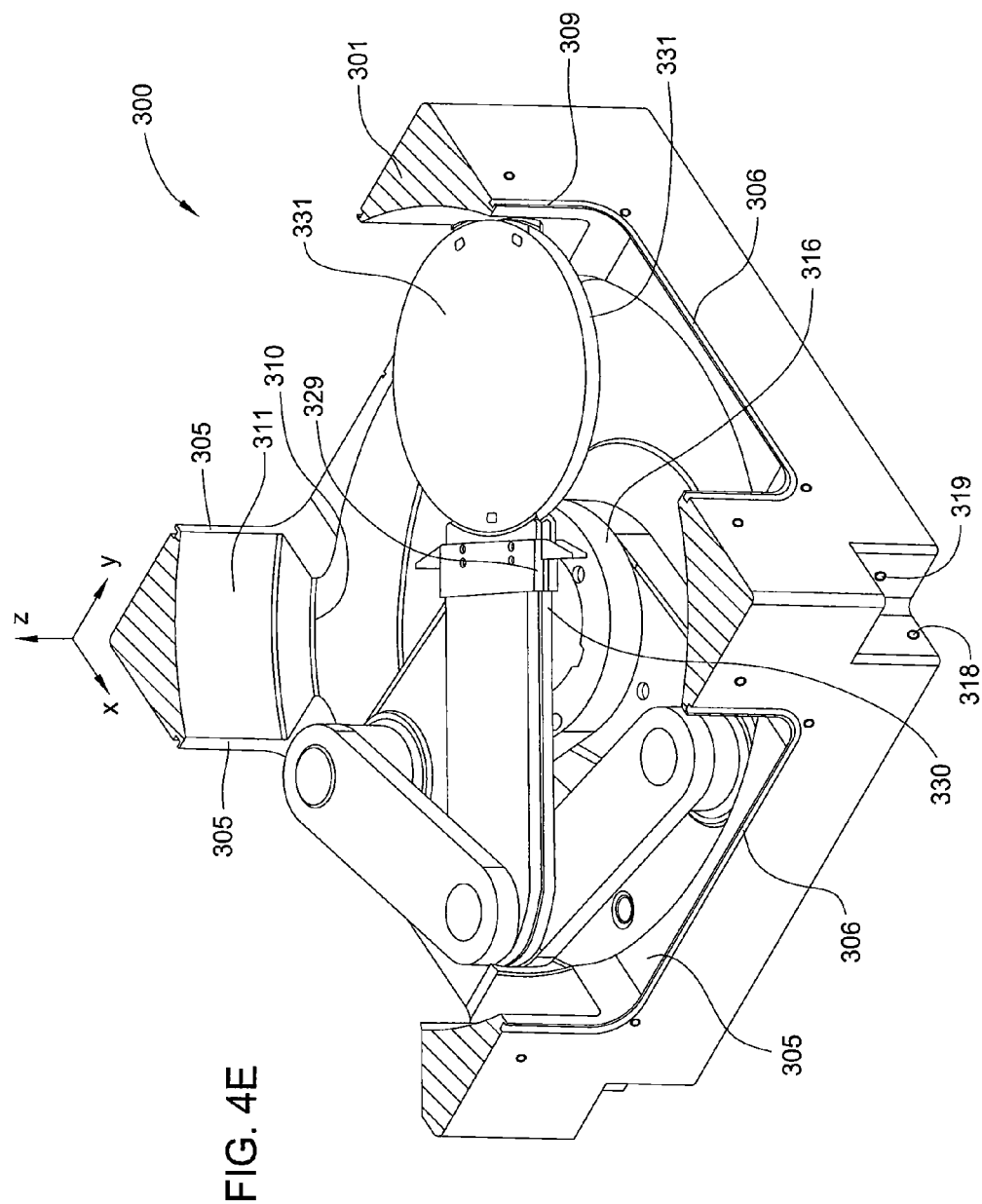
FIG. 4E schematically illustrates an isometric sectional view of the transfer chamber of FIG. 4A with a central robot in a rotation mode.

FIG. 4D schematically illustrates a bottom view of the transfer chamber 300 of FIG. 4A. One or more heater ports 320 may be formed on the bottom wall 315 and configured to connect to cartridge heaters for heating the chamber body 301 during processing. A gage port 321 may be formed in the bottom wall 315. The gage port 321 may be used to adapt sensors, such as a pressure sensor, therein. An optional pressure modification port 322, and vents 323 may also be formed on the bottom wall 315 for connection to suitable pumping devices. The gage port 321, the pressure modification port 322, and the vents 323 may be sealed off when not needed.

Figure 4F:
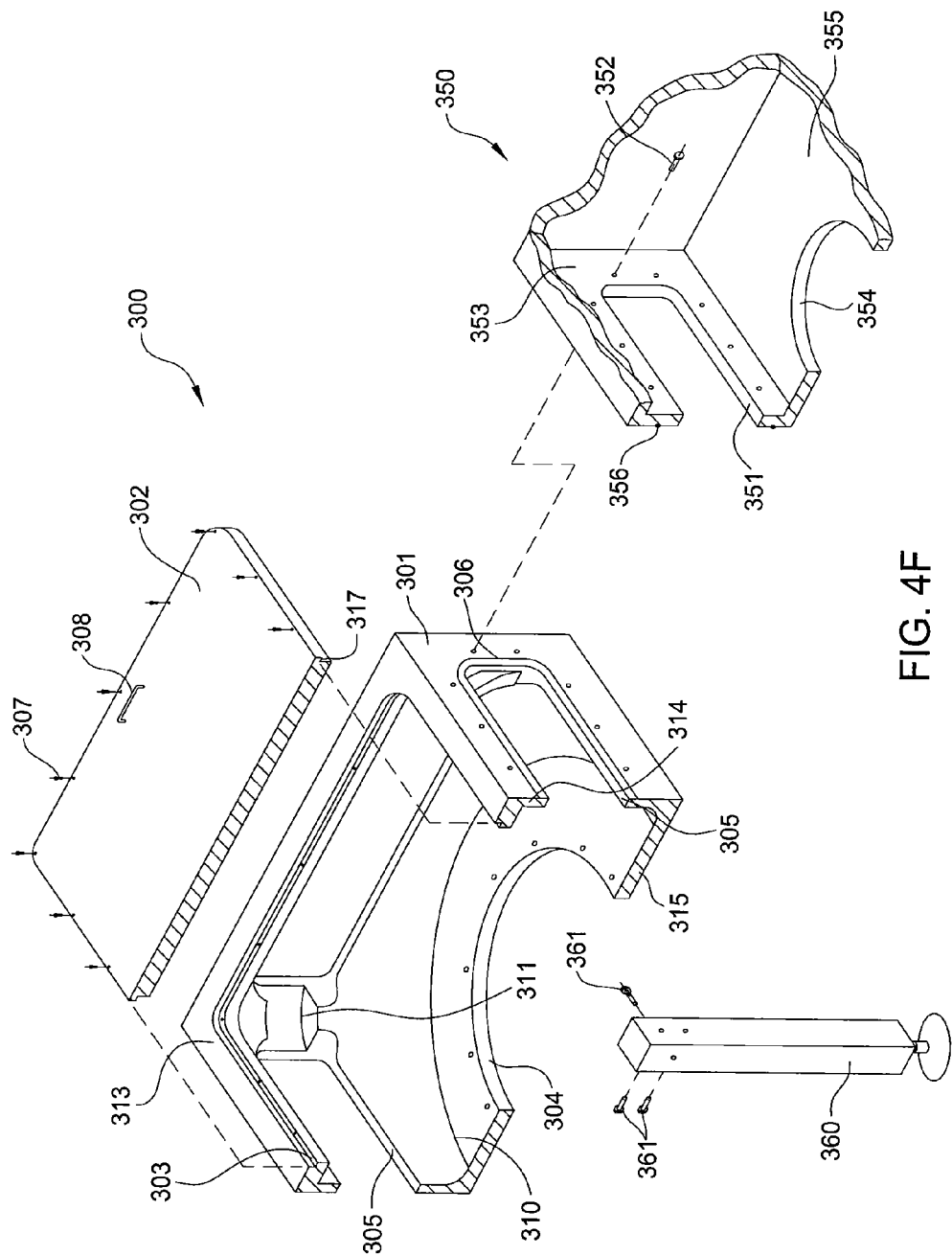
FIG. 4F schematically illustrates an isometric sectional view of the transfer chamber of FIG. 4A in connection with a vacuum extension of the present invention.

FIG. 4F schematically illustrates an exemplary vacuum extension chamber 350 configured to couple with one of the sidewalls 314 of the transfer chamber 300. In one embodiment, the vacuum extension chamber 350 is configured to provide the transfer chamber 300 an extra space for connection to a vacuum system to keep the inner volume 312 of the transfer chamber 300 in a vacuum condition during processing while minimizing the volume of the transfer chamber 300 and overall internal volume of the mainframe. The vacuum extension chamber 350 may also provide a pass way for a robot positioned in the transfer chamber 300 to a factory interface via a load lock chamber or another transfer chamber via a pass through chamber.

A pressure modification port 354 configured to adapt to a vacuum pump, such as a cryogenic pump, may be formed on a bottom wall 355 of the vacuum extension chamber 350. An opening 351 configured to connect the transfer chamber 300 is formed in a sidewall 353 of the vacuum extension chamber 350. The sidewall 353 of the vacuum extension chamber 350 is secured against the sidewall 314 of the transfer chamber 300, for example by a plurality of screws 352, when the vacuum extension chamber 350 is mounted on the transfer chamber 300. The opening 351 is aligned with the opening 305 to facilitate fluid communication and/or substrate traffic between the transfer chamber 300 and the vacuum extension chamber 350. In one embodiment, a seal ring 356 disposed in the gland 306 circumscribing the opening 305 may be used to fluidly isolate the inner volume of the vacuum extension chamber 350 and the transfer chamber 300 from an outside environment.

Figure 5A:
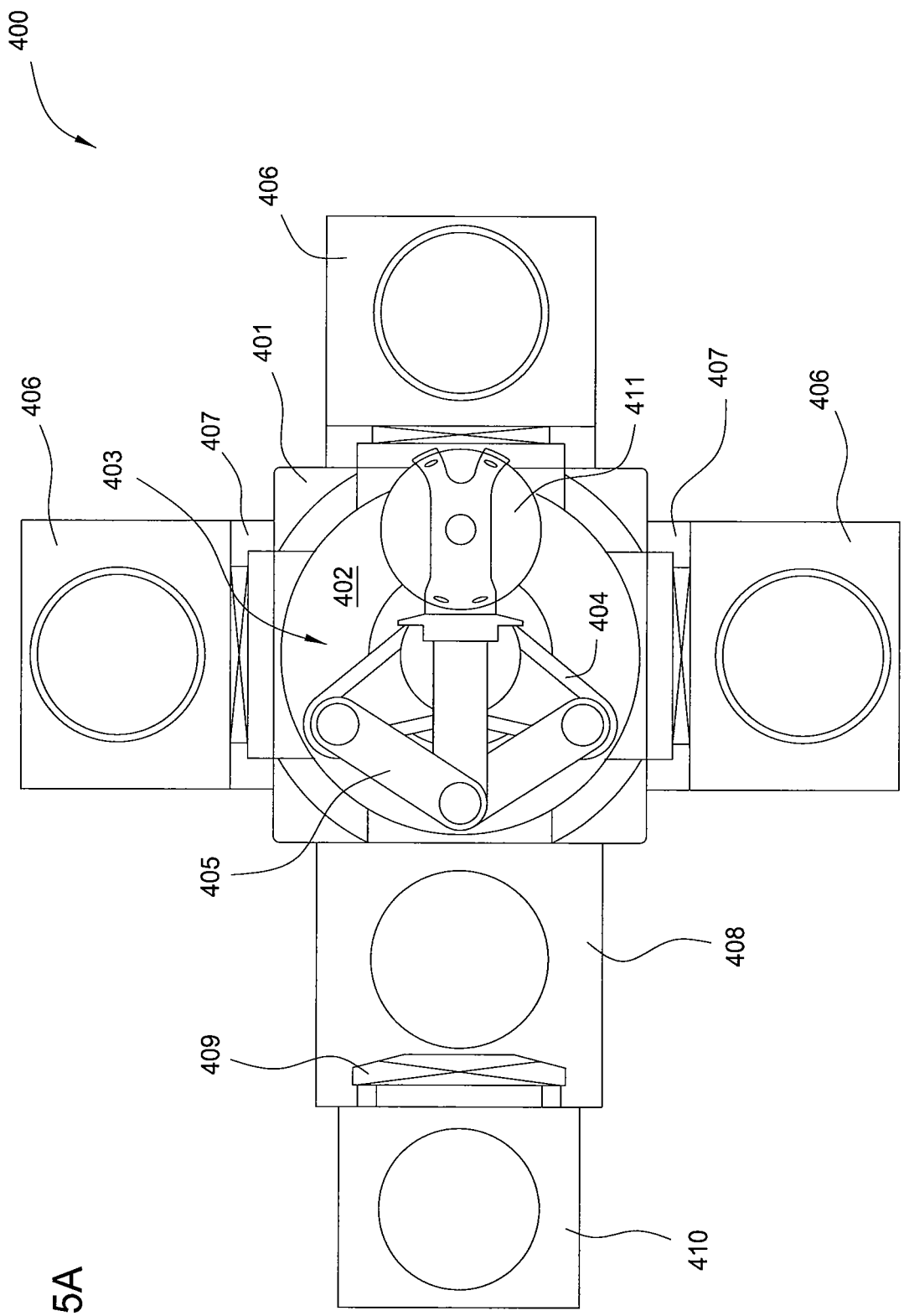
FIG. 5A schematically illustrates a plan view a cluster tool having a transfer chamber in accordance with one embodiment of the present invention.

FIG. 5A schematically illustrates a plan view a cluster tool 400 having a transfer chamber in accordance with one embodiment of the present invention. The cluster tool 400 comprises a transfer chamber 401, similar to the transfer chamber 300 of FIG. 4A. The transfer chamber 401 is connected to a vacuum extension chamber 408, which is further connected to a load lock chamber 410 via a slit valve assembly 409. Three processing chambers 406 are connected to the transfer chamber 401 via chamber port assemblies 407, similar to the chamber port assembly 370 of FIG. 4A. The transfer chamber 401 defines an inner volume 402 which may be maintained in a vacuum condition during processing by a pump system coupled to the vacuum extension chamber 408. The vacuum extension 401 may be configured to store one or more shutter disks to be used by the processing chambers 406.

A central robot 403 is disposed in the inner volume 402 of the transfer chamber 401. The central robot 403 is configured to transfer substrates and/or shutter disks among the processing chambers 406, the vacuum extension chamber 408 and the load lock chamber 410. The central robot 403 comprises a top arm 405 and a bottom arm 404, each having a blade configured to carry a substrate or shutter disk 411 thereon. Shown in FIG. 5A, both the top arm 405 and the bottom arm 404 are positioned in the transfer chamber 401.

Figure 5B:
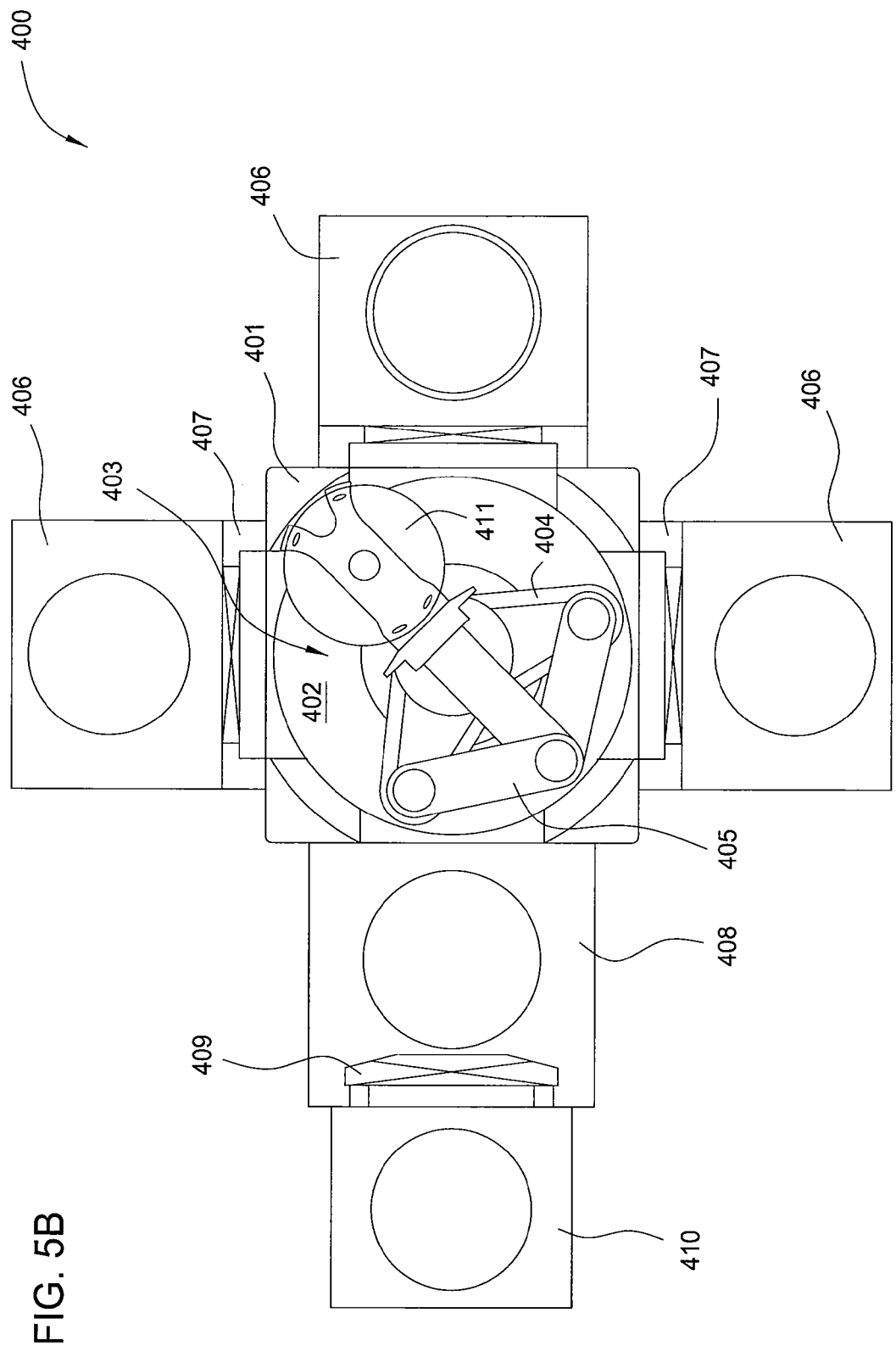
FIG. 5B schematically illustrates a plan view of the cluster tool of FIG. 5A wherein a central robot in a transfer chamber is in a rotation mode.

FIG. 5B schematically illustrates a plan view of the cluster tool 100 of FIG. 5A wherein the central robot 403 in the transfer chamber 401 rotates an angel from the central robot 403 shown in FIG. 5A. The central robot 403 may rotate both arms 404, 405 together or independently within the inner volume 402.

FIG. 5C schematically illustrates a plan view of the cluster tool 100 of FIG. 5A wherein the bottom arm 404 of the central robot 403 is accessing the vacuum extension chamber 408 connected to the transfer chamber 401.

Figure 5D:
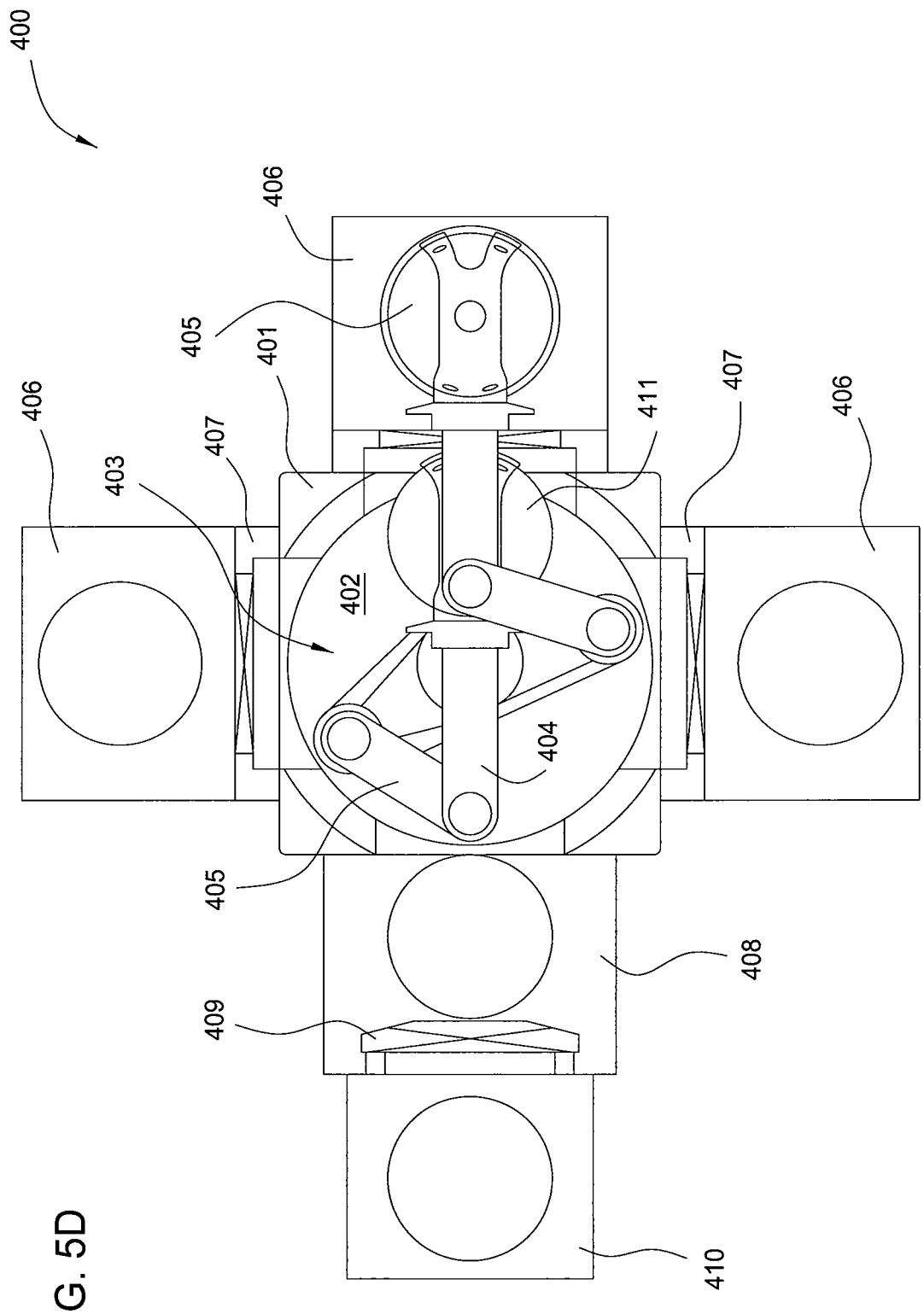
FIG. 5D schematically illustrates a plan view of the cluster tool of FIG. 5A wherein a central robot in a transfer chamber is accessing a load lock chamber connected with the transfer chamber.

FIG. 5D schematically illustrates a plan view of the cluster tool 100 of FIG. 5A wherein the bottom arm 404 of the central robot 403 is accessing a load lock chamber 410 connected with the transfer chamber 401 through the vacuum extension chamber 408.

Figure 5E:
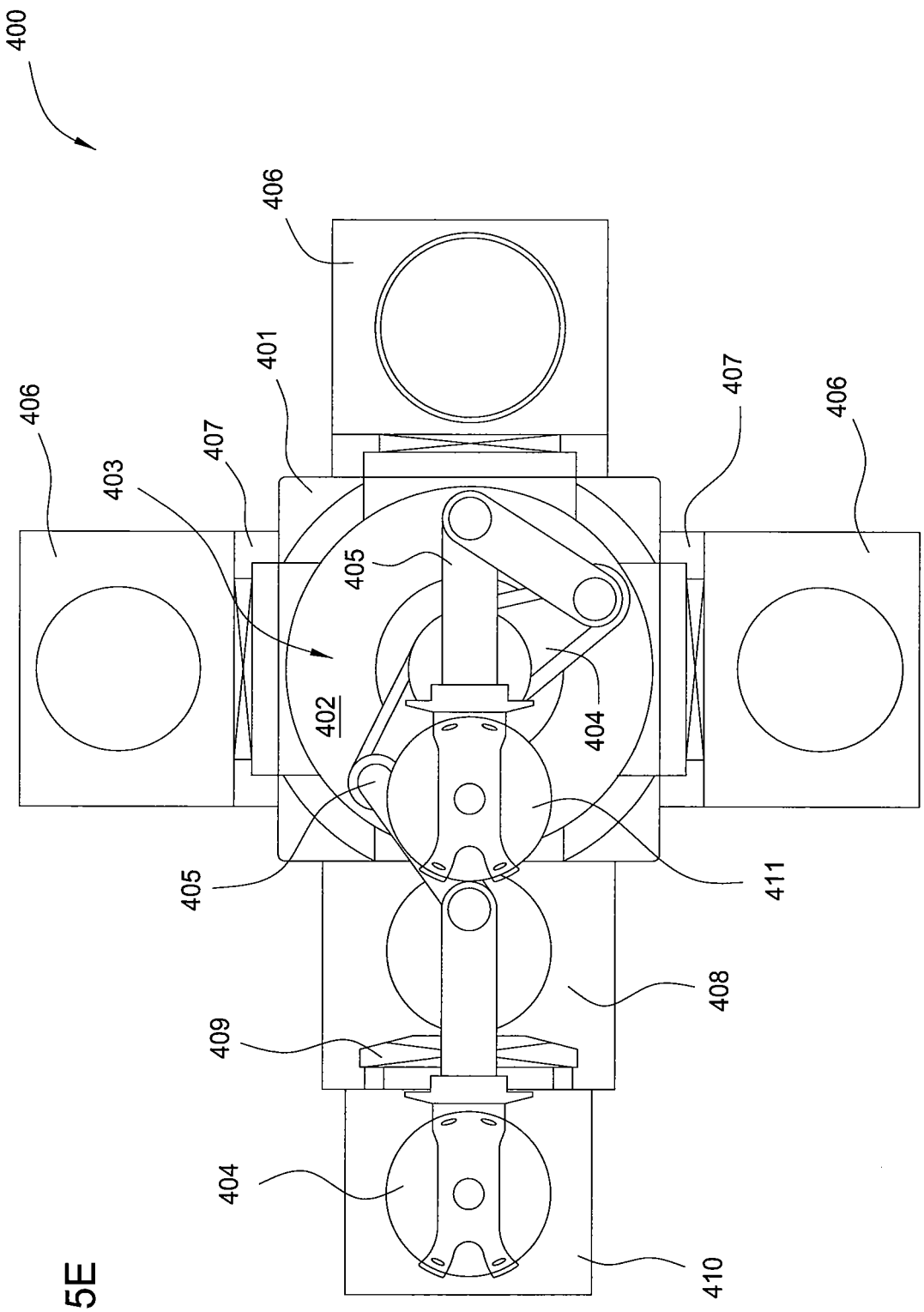
FIG. 5E schematically illustrates a plan view of the cluster tool of FIG. 5A wherein a central robot in a transfer chamber is accessing processing chamber connected to the transfer chamber FIG. 6A schematically illustrates an exploded view of a vacuum extension in accordance with one embodiment of the present invention. The vacuum extension has a movable shelf.

FIG. 5E schematically illustrates a plan view of the cluster tool 100 of FIG. 5A wherein the top arm 405 of the central robot 403 is accessing the processing chamber 406 connected to the transfer chamber 401.

Figure 6A:
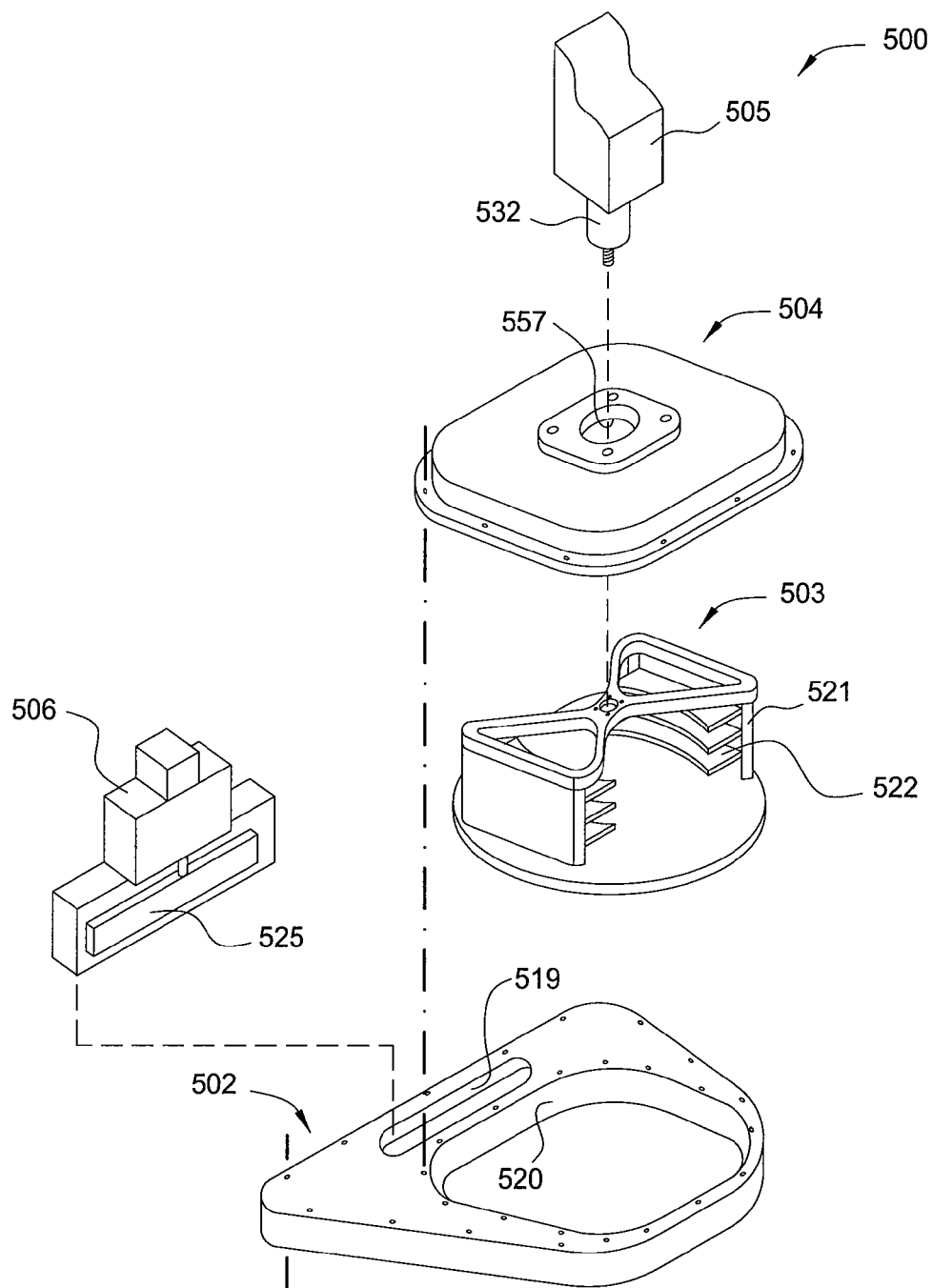
FIG. 6B schematically illustrates a sectional side view of the vacuum extension shown in FIG. 6A.
FIG. 6C schematically illustrates a sectional side view of the vacuum extension of FIG. 6A with the movable shelf in a down position.
Figure 6A:
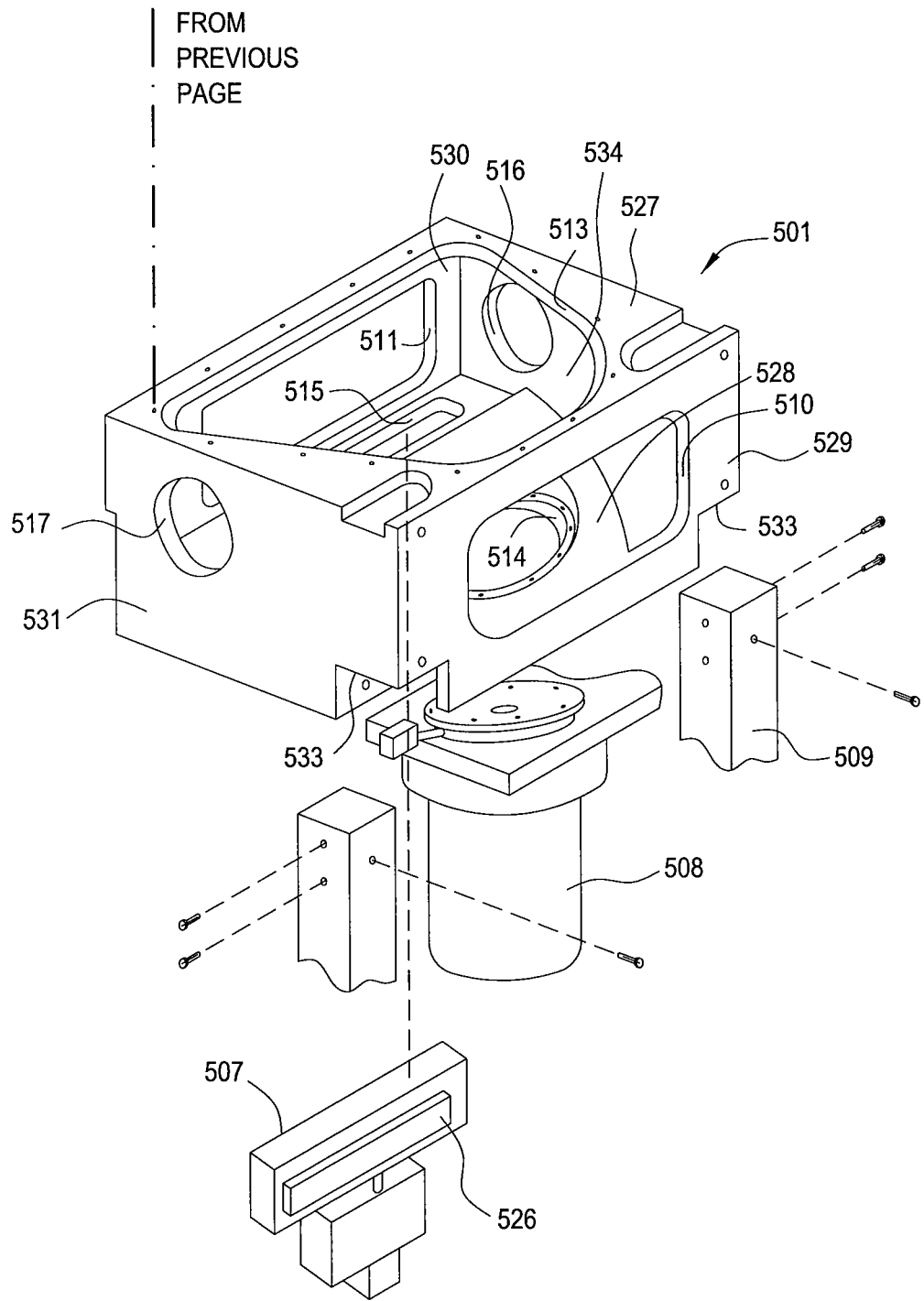

FIG. 6A schematically illustrates an exploded view of a vacuum extension assembly 500 in accordance with one embodiment of the present invention. The vacuum extension assembly 500 is configured to connect to a transfer chamber, such as the transfer chamber 300 of FIG. 4A, and to provide an interface between the transfer chamber and a load lock chamber and a fluid communication between the transfer chamber and a vacuum system.

The vacuum extension assembly 500 comprises a body 501 defining an inner volume 512 (marked in FIG. 6B), a top plate 502 disposed on a top wall 527 of the body 501, and a shelf cover 504 disposed on the top plate 502.

A pressure modification port 514 may be formed on a bottom wall 528 of the body 501. The pressure modification port 514 is configured to connect a vacuum pump 508 to provide a low pressure environment to the inner volume 512 and volumes in fluid communication with the inner volume 512. In one embodiment, an opening 513 may be formed on the top wall 527 of the body 501. The opening 513 may be used to access the inner volume 512 during installation and/or maintenance of the vacuum pump 508.

As shown in FIG. 6A, the top plate 502 is configured to cover the opening 513 on the top wall 527. The top plate 502 may have a slit valve opening 519 and a shelf opening 520 formed therein. The slit valve opening 519 is configured for installation of a slit valve 506. The shelf opening 520 is configured to allow a movable shelf 503 to be positioned at a selected elevation within the inner volume 512.

In one embodiment, a chamber opening 510 may be formed on a sidewall 529 which is configured to be coupled with a transfer chamber, such as the transfer chamber 300 of FIG. 4A. The chamber opening 510 is configured to provide fluid communication with the transfer chamber and to provide passage for robot blades coupled to a robot disposed in the transfer chamber, to transfer substrates, and/or shutter disks. Therefore, width of the chamber opening 510 is generally slightly larger than a diameter of the largest substrate configured to be processed in a cluster tool. The height of the chamber opening 510 is determined by the motion range of the robot blades.

In one embodiment, a load lock opening 511 may be formed on a sidewall 530 opposite to the sidewall 529. The load lock opening 511 is configured to provide selective communication between the inner volume 512 and one or more load lock chambers coupled to the side wall 529. In one embodiment, one or more slit valves may be used to selectively seal the load lock opening 511. As shown in FIG. 6A, a slit valve opening 515 is formed on the bottom wall 528 and is configured to allow a slit valve 507 to be disposed inside the inner volume 512 and to selectively seal the load lock opening 511. In one embodiment, two slit valves 506, 507 may be used to provide selective fluid communication between the inner volume 512 and two load lock chambers independently via the load lock opening 511.

In one embodiment, the shelf cover 504 is disposed above the top plate 502 sealing the shelf opening 520. The shelf cover 504 provides space in connection with the inner volume 512 to store a movable shelf 503 therein. The movable shelf 503 is configured to support one or more shutter disks thereon. The shutter disks may be used by processing chambers connected to the transfer chamber that connects to the vacuum extension assembly 500. In one embodiment, the movable shelf 503 may comprise two opposing posts 521, each having one or more supporting fingers 522 extending therefrom. The supporting fingers 522 are configured to support a shutter disk from the edge.

In one embodiment, the movable shelf 503 may be connected to an indexer 505. The indexer 505 may be disposed above the shelf cover 504. A shaft 532 extends from the indexer 505 through an aperture 557 in the shelf cover 504 and connects to the movable shelf 503. The shaft 532 moves vertically providing vertical movement to the movable shelf 503, so that the elevation of the movable shelf 503 may be selected.

In one embodiment, notches 533 may be formed on the bottom wall 528 and configured to accept independent supporting legs 509 therein. In one embodiment, windows 516, 517 may be formed on sidewalls 531, 534 of the body 501 and utilized for observing the interior of the vacuum extension assembly 500. Transparent materials, such as quartz, may be used to seal the windows 516, 517.

Figure 6B:
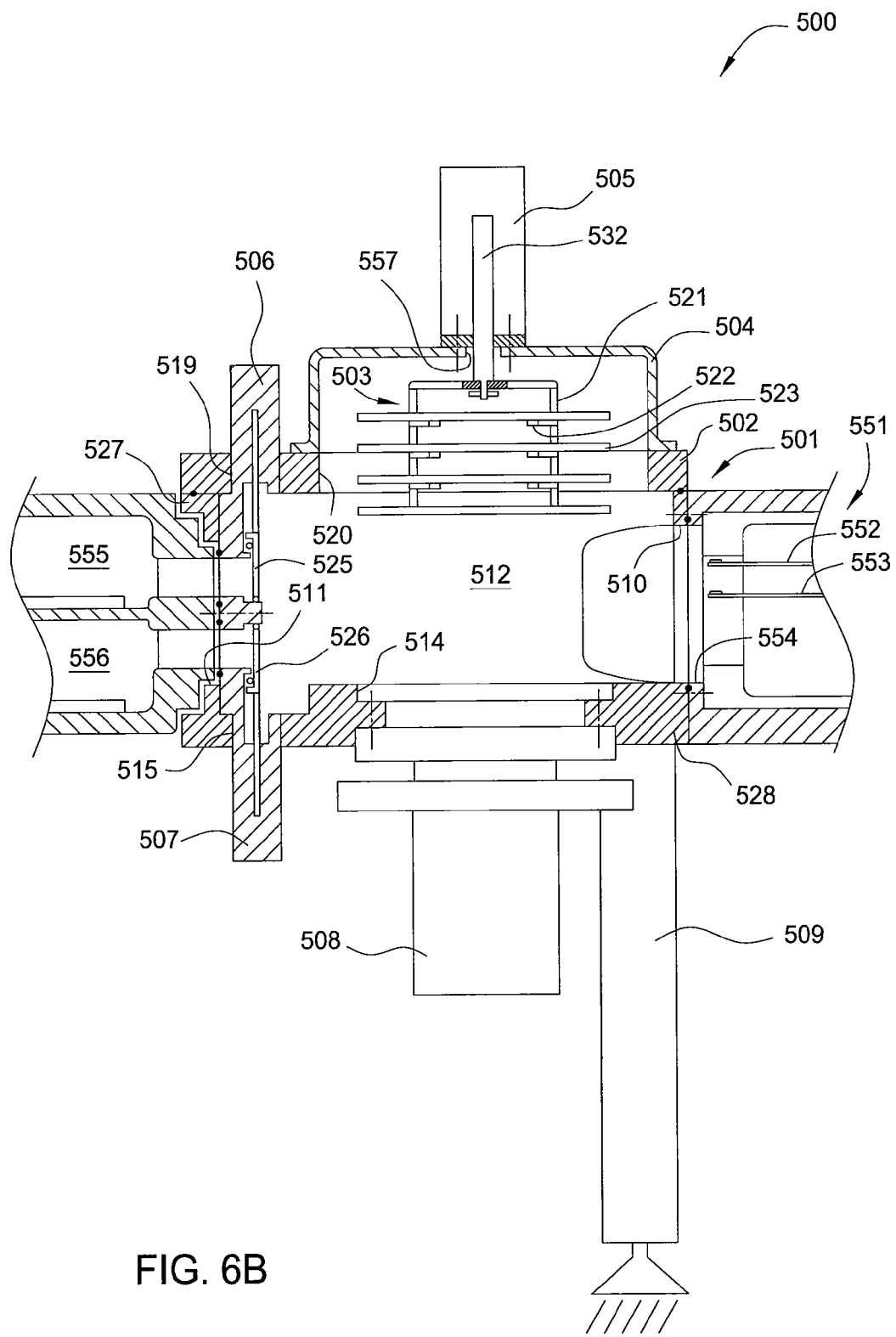

FIG. 6B schematically illustrates a sectional side view of the vacuum extension assembly 500 shown in FIG. 6A. A transfer chamber 551, partially shown, is connected to the vacuum extension assembly 500. The transfer chamber 551 is in fluid communication with the inner volume 512 of the vacuum extension assembly 500 via the chamber opening 510 of the vacuum extension assembly 500 and an opening 554 of the transfer chamber 551. Load locks chambers 555, 556 are connected to the vacuum extension assembly 500 on a side opposing the transfer chamber 551. The load lock chamber 555, 556 are connected to the inner volume 512 via slit valve doors 525, 526 respectively. Robot blades 552, 553, disposed in the transfer chamber 551, are configured to access the load lock chambers 555, 556 via the inner volume 512 of the vacuum extension assembly 500.

As shown in FIG. 6B, the movable shelf 503 is retracted to an upper portion of the inner volume 512, thus providing a clear passage for the robot blades 552, 553 extend past the movable shelf 503 to the load lock chambers 555, 556.

Figure 6C:
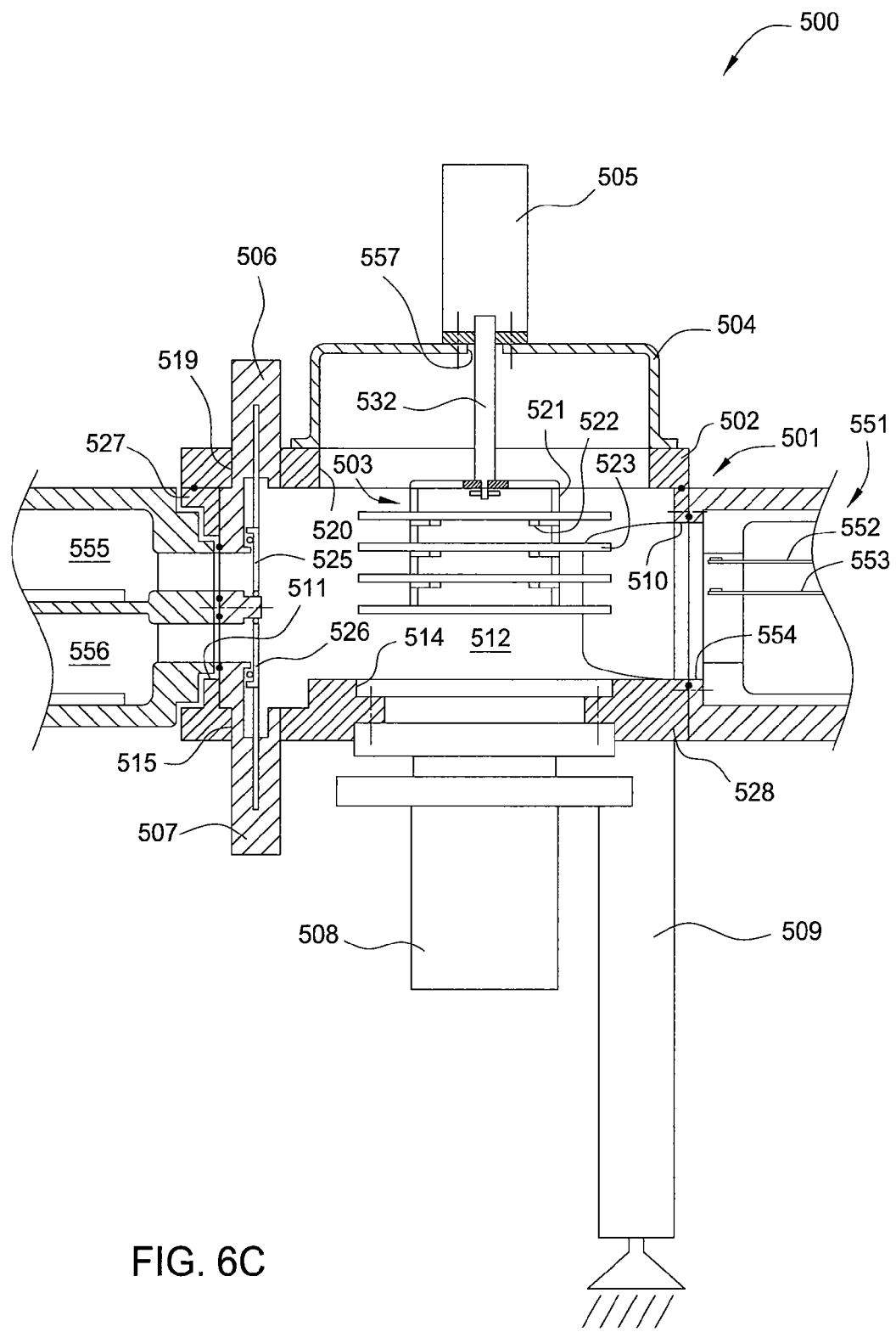

FIG. 6C schematically illustrates a sectional side view of the vacuum extension assembly 500 with the movable shelf 503 lowered to a down position. The movable shelf 503 is positioned by the indexer 505 in a lower portion of the inner volume 512 such that shutter disks 523 may be picked up from and dropped onto the supporting fingers 522 by the robot blades 552, 553. The hand-off between the robot blades 552, 553 and the movable shelf 503 may be facilitated by at least one of moving the movable shelf 503 or the robot blades 552, 553 vertically.

The body 501, top plate 502, shelf cover 504, and movable shelf 503 may be made from any suitable material. In one embodiment, the body 501, top plate 502, shelf cover 504, and movable shelf 503 are made of cast aluminum.

It should be noted that position of indexer 505 may be positioned in a bottom of the vacuum extension assembly 500 while the vacuum pump 508 are mounted on top.

FIG. 7A schematically illustrates an isometric view of the movable shelf 503 in accordance with one embodiment of the present invention. The movable shelf 503 comprises a bottom disk 580 and two posts 521 extended from the bottom disk 580. The two posts 521 may be positioned on opposite sides of the bottom disk 580. One or more supporting fingers 522 extend from each of the posts 521. Each pair of supporting fingers 522 extending from opposite posts 521 is configured to support a disk near an edge of the disk. In one embodiment, vertical distance between neighboring support fingers 522 may be arranged so that a robot blade may pick up or drop off shutter disks from/to each pair of support fingers 522. A bridge 581 may be formed between the posts 521. The bridge 581 may be configured to couple with an indexer so that the movable shelf 503 may be translated.

FIG. 7B schematically illustrates a supporting finger 522a in accordance with one embodiment of the present invention. The supporting finger 522a is configured to directly support a shutter disk near the edge.

FIG. 7C schematically illustrates a supporting finger 522b in accordance with one embodiment of the present invention. The supporting finger 522 has two contact posts 585 disposed on a top surface. The contact posts 585 are configured to contact a shutter disk and provide point support to reduce particle contamination. In one embodiment, the contact posts 585, including a substrate supporting roller, may be made from non-metallic material, such as silicon nitride (SiN).

Figure 8A:
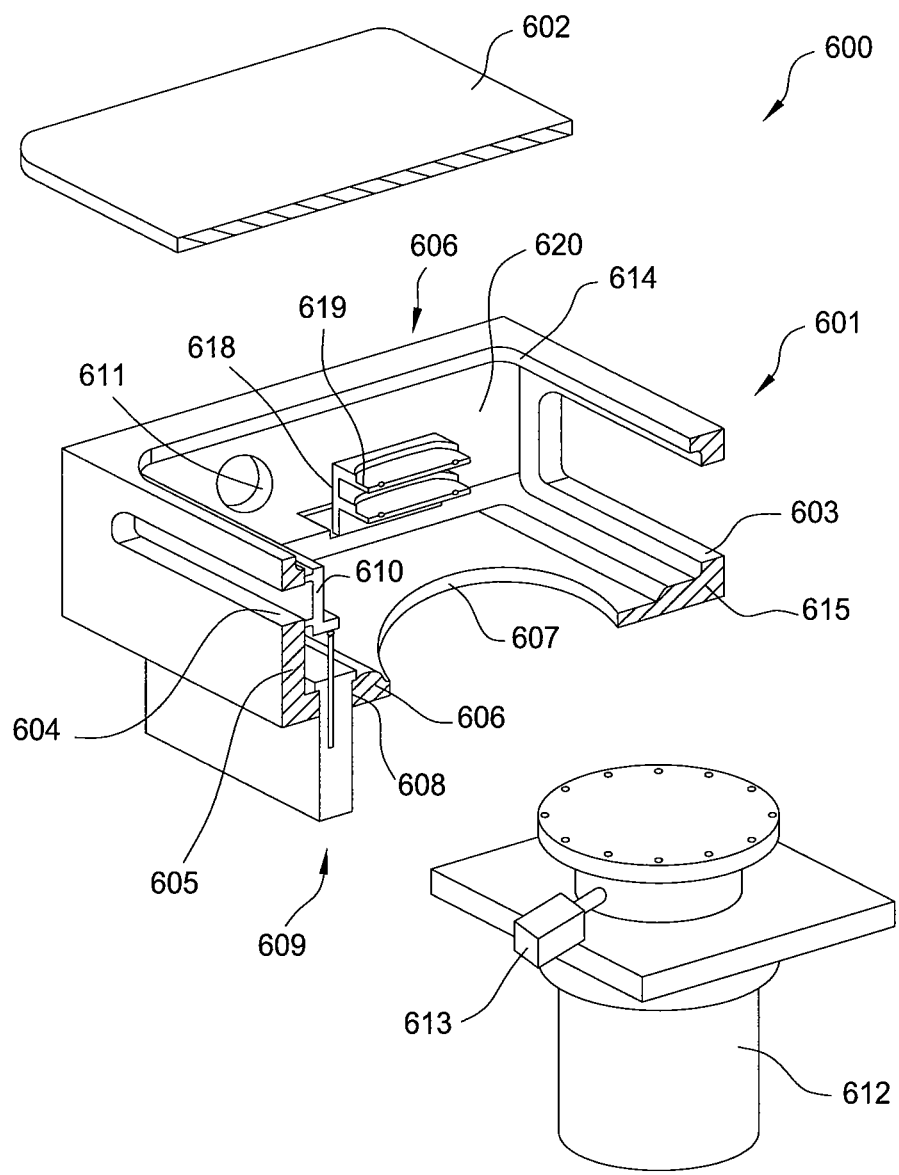
FIG. 8A schematically illustrates an isometric sectional view of a vacuum extension having a stationary shelf in accordance with one embodiment of the present invention.

FIG. 8A schematically illustrates an isometric sectional view of a vacuum extension assembly 600 having a stationary shelf in accordance with one embodiment of the present invention. The vacuum extension assembly 600 is configured to connect to a transfer chamber, such as the transfer chamber 300 of FIG. 4A, and to provide an interface between the transfer chamber and a load lock chamber and to provide fluid communication between the transfer chamber and a vacuum system.

Figure 8B:
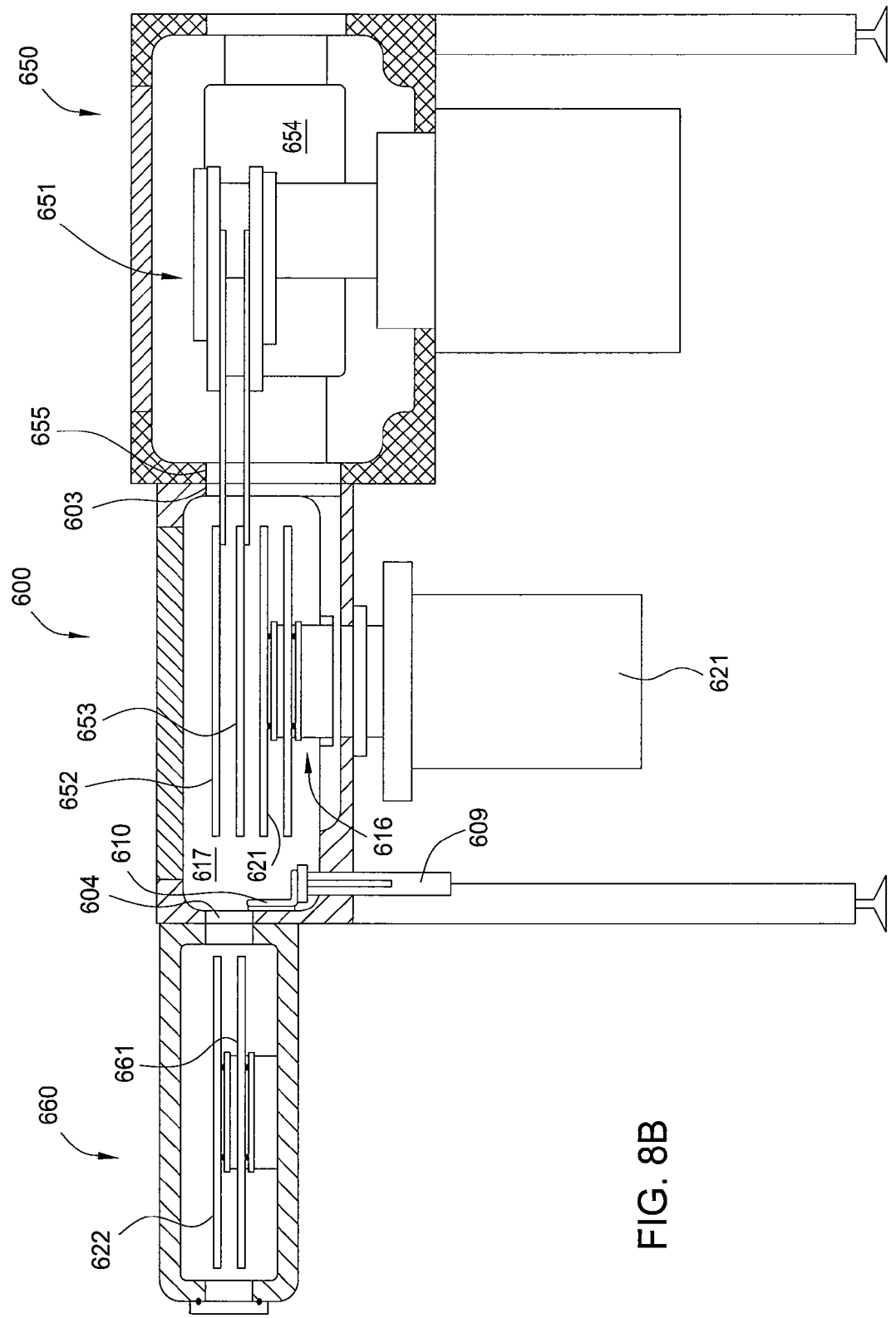
FIG. 8B schematically illustrates a sectional side view of a mainframe having a vacuum extension of FIG. 8A.

The vacuum extension assembly 600 comprises a body 601 and a top plate 602 defining an inner volume 617 (marked in FIG. 8B). A pressure modification port 607 may be formed on a bottom wall 606 of the body 601. The pressure modification port 607 is configured to connect a vacuum system 612 to provide a low pressure environment to the inner volume 617 and volumes in fluid communication with the inner volume 617. In one embodiment, a sensor 613 may be disposed on the vacuum system 612 outside the body 601 and configured to monitor status of the vacuum system 612. In one embodiment, an opening 614 may be formed on a top wall of the body 601. The opening 614 may be used to access the inner volume 617 during installation and/or maintenance of the vacuum system 612. The top plate 602 is used to seal the opening 614.

In one embodiment, a chamber opening 603 may be formed on a sidewall 615 of the vacuum extension assembly 600 which is configured to be coupled with a transfer chamber, such as the transfer chamber 300 of FIG. 4A. The chamber opening 603 is configured to provide fluid communication with the transfer chamber and to provide passage for robot blades, typically disposed on a robot in the transfer chamber, to transfer substrates, and/or shutter disks. Therefore, width of the chamber opening 603 is generally slightly larger than a diameter of the largest substrate configured to be processed in a cluster tool. The height of the chamber opening 603 is selected to allow an appropriate range for robotic suitable for exchanging substrate and/or shutter disks between the shelf and the robot blades.

In one embodiment, a load lock opening 604 may be formed on a sidewall 605 opposite to the sidewall 615. The load lock opening 604 is configured to provide selective communication between the inner volume 617 and one or more load lock chambers coupled to the side wall 605. A slit valve opening 608 is formed through the bottom wall 606 and is configured to allow a slit valve 609 to be disposed inside the inner volume 617. The slit valve 609 selectively seals the load lock opening 604.

In one embodiment, a shutter disk shelf 616 is disposed within the inner volume 617 of the vacuum extension assembly 600. The shutter disk shelf 616 is configured to support one or more shutter disks thereon. The shutter disks may be used by processing chambers connected to the vacuum extension assembly 600 via the transfer chamber. The shutter disk shelf 616 is positioned in a portion of the inner volume 617 so that the passage between the chamber opening 603 and the load lock opening 604 is maintained to allow the robot clear access through the vacuum extension assembly 600. In one embodiment, as shown in FIG. 8B, the shutter disk shelf 616 is positioned in a lower portion of the inner volume 617, while the load lock opening 604 corresponding to an upper portion of the inner volume 617. The height of the chamber opening 603 is large enough to accommodate sufficient vertical motion of the robot blades to allow access to both the load lock opening 603 and the shutter disk shelf 616.

In one embodiment, the shutter disk shelf 616 may comprise two opposing posts 618, each having one or more supporting fingers 619 extending therefrom. The supporting fingers 619 are configured to support a shutter disk near a periphery. Embodiments of the supporting fingers 619 may be similar to those shown in FIGS. 7B-C. In one embodiment, the fingers 619 may include a roller contact for supporting the shutter disk thereon.

In one embodiment, a window 611 may be formed through a sidewall 620 of the body 601 to allow the interior of the vacuum extension assembly 600 to be viewed. Transparent materials, such as quartz, may be used to seal the window 611.

The body 601, top plate 602, and shutter disk shelf 616 may be made from any suitable material. In one embodiment, the body 601, top plate 602, and shutter disk shelf 616 are made of cast aluminum.

FIG. 8B schematically illustrates a sectional side view of a mainframe having the vacuum extension assembly 600 of FIG. 8A. A transfer chamber 650 is connected to the vacuum extension assembly 600. An inner volume 654 of the transfer chamber 650 is in fluid communication with the inner volume 617 of the vacuum extension assembly 600 via the chamber opening 603 of the vacuum extension assembly 600 and an opening 655 of the transfer chamber 650. A load lock chamber 660 is connected to the vacuum extension assembly 600 on a side opposing the transfer chamber 650. The load lock chamber 660 may comprise a substrate support 661 configured to support one or more substrates. The load lock chamber 660 is selectively connected to the inner volume 617 via a slit valve door 610. A central robot 651 is disposed in the inner volume 654 of the transfer chamber 650. The central robot 651 comprises two robot blades 652, 653. The central robot 651 is configured with arrange of motion to allow the robot blades 652, 653 to access the load lock chamber 660 via an upper portion of the inner volume 617 of the vacuum extension assembly 600, and to the shutter disk shelf 616 disposed in the lower portion of the inner volume 617 of the vacuum extension assembly 600.

As shown in FIG. 8B, the robot blades 652, 653 may be actuated over the shelf 616 on the way to the load lock chamber 660 to pick up substrates 622. The slit valve door 610 is moved to an open position to allow the robot blades 652, 653 to enter the load lock chamber 660.

Figure 8C:
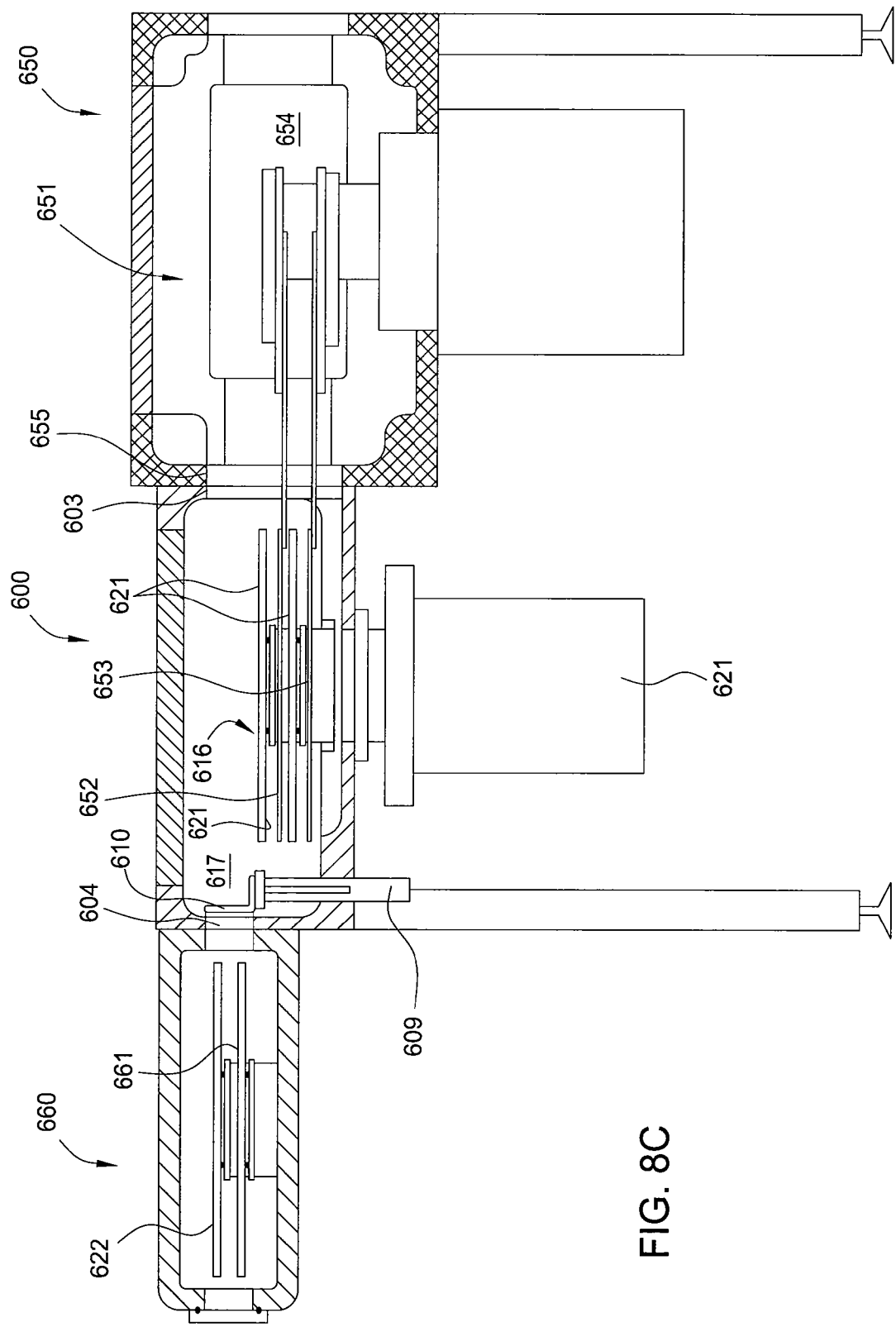
FIG. 8C schematically illustrates a sectional side view of the mainframe of FIG. 8B showing a robot accessing shutter disks disposed in the vacuum extension.

FIG. 8C schematically illustrates a sectional side view of the mainframe of FIG. 8B showing the central robot 651 positioning the robot blades 652, 653 in a lowered position to access the shutter disks 621 disposed in the shutter disk shelf 616 within the vacuum extension assembly 600.

Figure 9:
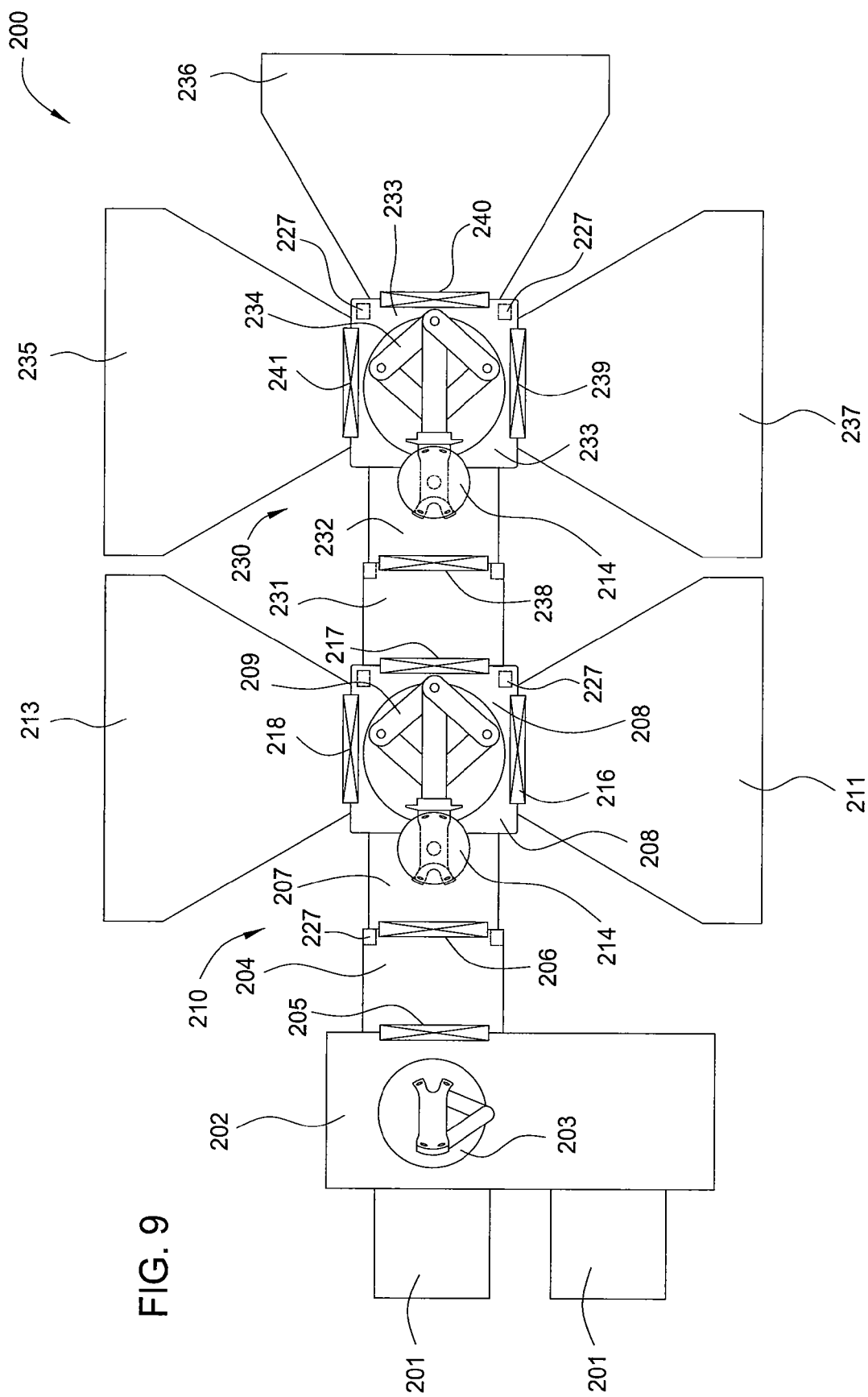
FIG. 9 schematically illustrates a plan view of a cluster tool in accordance with one embodiment of the present invention.
Figure 10:
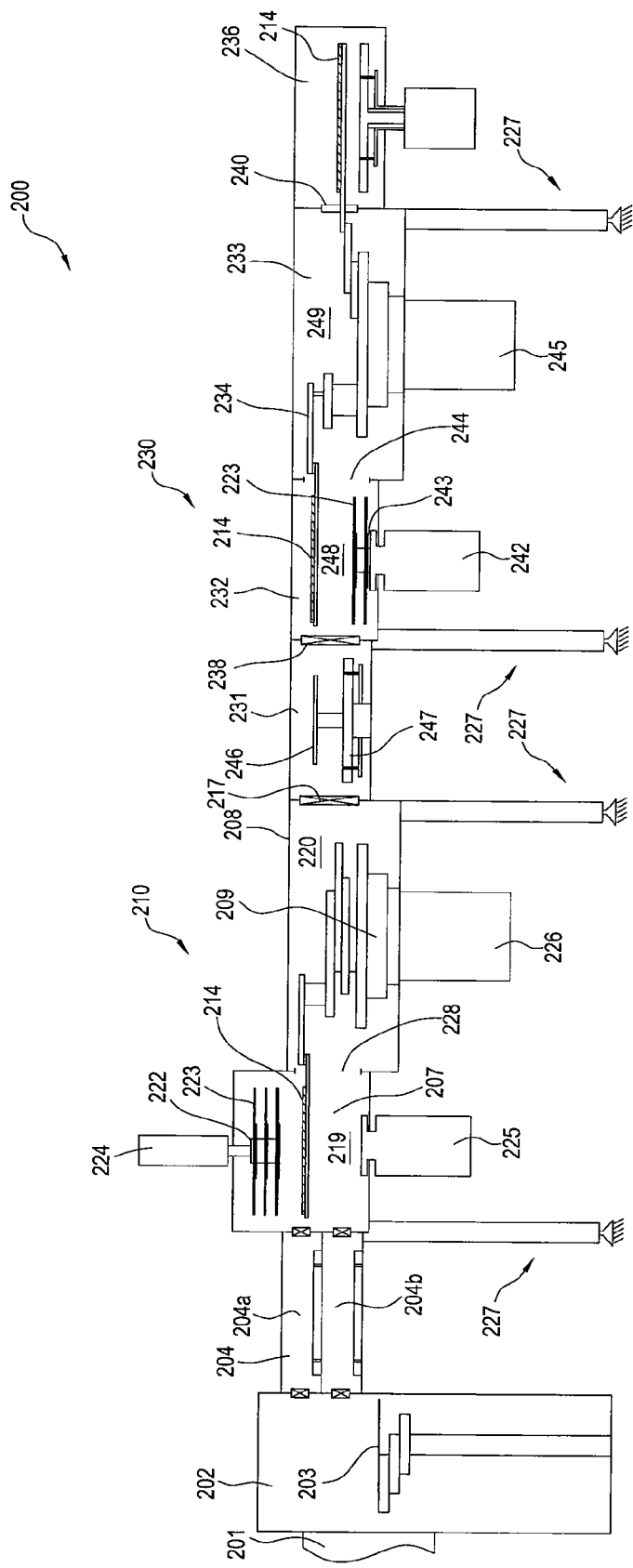
FIG. 10 schematically illustrate a sectional side view of the cluster tool of FIG. 9.

FIG. 9 schematically illustrates a plan view of a cluster tool 200 in accordance with one embodiment of the present invention. FIG. 10 schematically illustrates a sectional side view of the cluster tool 200 of FIG. 9. The cluster tool 200 comprises multiple processing chambers coupled a mainframe comprising two transfer chambers.

The cluster tool 200 comprises a front-end environment 202 in selective communication with a load lock chamber 204. One or more pods 201 are coupled to the front-end environment 202. The one or more pods 201 are configured to store substrates. A factory interface robot 203 is disposed in the front-end environment 202. The factory interface robot 203 is configured to transfer substrates between the pods 201 and the load lock chamber 204.

The load lock chamber 204 provides a vacuum interface between the front-end environment 202 and a first transfer chamber assembly 210. An internal region of the first transfer chamber assembly 210 is typically maintained at a vacuum condition and provides an intermediate region in which to shuttle substrates from one chamber to another and/or to a load lock chamber.

In one embodiment, the first transfer chamber assembly 210 is divided into two parts. In one embodiment of the present invention, the first transfer chamber assembly 210 comprises a transfer chamber 208 and a vacuum extension chamber 207. The transfer chamber 208 and the vacuum extension chamber 207 are coupled together and in fluid communication with one another. An inner volume of the first transfer chamber assembly 210 is typically maintained a low pressure or vacuum condition during process. The load lock chamber 204 may be connected to the front-end environment 202 and the vacuum extension chamber 207 via slit valves 205 and 206 respectively.

In one embodiment, the transfer chamber 208 may be a polygonal structure having a plurality of sidewalls, a bottom and a lid. The plurality sidewalls may have opening formed therethrough and are configured to connect with processing chambers, vacuum extension and/or pass through chambers. The transfer chamber 208 shown in FIG. 9 has a square or rectangular shape and is coupled to processing chambers 211, 213, a pass through chamber 231 and the vacuum extension chamber 207. The transfer chamber 208 may be in selective communication with the processing chambers 211, 213, and the pass through chamber 231 via slit valves 216, 218, and 217 respectively.

In one embodiment, a central robot 209 may be mounted in the transfer chamber 208 at a robot port formed on the bottom of the transfer chamber 208. The central robot 209 is disposed in an internal volume 220 of the transfer chamber 208 and is configured to shuttle substrates 214 among the processing chambers 211, 213, the pass through chamber 231, and the load lock chamber 204. In one embodiment, the central robot 209 may include two blades for holding substrates, each blade mounted on an independently controllable robot arm mounted on the same robot base. In another embodiment, the central robot 209 may have the capacity for vertically moving the blades.

The vacuum extension chamber 207 is configured to provide an interface to a vacuum system to the first transfer chamber assembly 210. In one embodiment, the vacuum extension chamber 207 comprises a bottom, a lid and sidewalls. A pressure modification port may be formed on the bottom of the vacuum extension chamber 207 and is configured to adapt to a vacuuming pump system. Openings are formed on the sidewalls so that the vacuum extension chamber 207 is in fluid communication with the transfer chamber 208, and in selective communication with the load lock chamber 204.

In one embodiment, the cluster tool 200 may be configured to deposit a film on semiconductor substrates using physical vapor deposition (PVD) process. During conditioning operations, a dummy substrate or a shutter disk is disposed on the pedestal to protect the substrate support from any deposition.

In one embodiment of the present invention, the vacuum extension chamber 207 comprises a shutter disk shelf 222, shown in FIG. 10, configured to store one or more shutter disks 223. Processing chambers directly or indirectly connected to the transfer chamber 208 may store their shutter disks in the shutter disk shelf 222 and use the central robot 209 to transfer the shuttle disks.

The cluster tool 200 further comprises a second transfer chamber assembly 230 connected to the first transfer chamber assembly 210 by the pass through chamber 231. In one embodiment, the pass through chamber 231, similar to a load lock chamber, is configured to provide an interface between two processing environments. In this case, the pass through chamber 231 provides a vacuum interface between the first transfer chamber assembly 210 and the second transfer chamber assembly 230.

In one embodiment, the second transfer chamber assembly 230 is divided into two parts to minimize the footprint of the cluster tool 200. In one embodiment of the present invention, the second transfer chamber assembly 230 comprises a transfer chamber 233 and a vacuum extension chamber 232 in fluid communication with one another. An inner volume of the second transfer chamber assembly 230 is typically maintained a low pressure or vacuum condition during process. The pass through chamber 231 may be connected to the transfer chamber 208 and the vacuum extension chamber 232 via slit valves 217 and 238 respectively so that the pressure within the transfer chamber 208 may be maintained at different vacuum levels.

In one embodiment, the transfer chamber 233 may be a polygonal structure having a plurality of sidewalls, a bottom and a lid. The plurality sidewalls may have opening formed therein and are configured to connect with processing chambers, vacuum extension and/or pass through chambers. The transfer chamber 233 shown in FIG. 9 has a square or rectangular shape and is coupled to processing chambers 235, 236, 237, and the vacuum extension chamber 232. The transfer chamber 233 may be in selective communication with the processing chambers 235, 236, via slit valves 241, 240, 239 respectively.

A central robot 234 is mounted in the transfer chamber 233 at a robot port formed on the bottom of the transfer chamber 233. The central robot 234 is disposed in an internal volume 249 of the transfer chamber 233 and is configured to shuttle substrates 214 among the processing chambers 235, 236, 237, and the pass through chamber 231. In one embodiment, the central robot 234 may include two blades for holding substrates, each blade mounted on an independently controllable robot arm mounted on the same robot base. In another embodiment, the central robot 234 may have the capacity for moving the blades vertically.

In one embodiment, the vacuum extension chamber 232 is configured to provide an interface between a vacuum system and the second transfer chamber assembly 230. In one embodiment, the vacuum extension chamber 232 comprises a bottom, a lid and sidewalls. A pressure modification port may be formed on the bottom of the vacuum extension chamber 232 and is configured to adapt to a vacuum system. Openings are formed through the sidewalls so that the vacuum extension chamber 232 is in fluid communication with the transfer chamber 233, and in selective communication with the pass through chamber 231.

In one embodiment of the present invention, the vacuum extension chamber 232 includes a shutter disk shelf 243, shown in FIG. 10, configured to store one or more shutter disks 223. Processing chambers directly or indirectly connected to the transfer chamber 233 may store their shutter disks in the shutter disk shelf 243 and use the central robot 234 to transfer the shuttle disks.

In one embodiment, the cluster tool 200 may be configured to perform a PVD process. The processing chamber 211 may be a pre-clean chamber configured to perform a cleaning process prior to a PVD process. The processing chambers 235, 236, 237 may be PVD chambers configured to deposition a thin film on a substrate using physical vapor deposition. The processing chamber 213 may be a de-gas chamber configured to degas and clean a substrate after a deposition process in a PVD chamber.

In one embodiment, the transfer chambers 208, 233 may have a similar design as shown in FIGS. 4A-4F. The transfer chambers 208, 233 are configured to minimize foot print of the cluster tool 200 and are connected to a vacuum system through separated vacuum extensions.

The vacuum extension chambers 207, 232 may have similar designs of the vacuum extension assemblies 500 and 600 shown in FIGS. 6A-6C and FIGS. 8A-8C.

As shown in FIG. 10, the load lock chamber 204 comprises an upper load lock chamber 204a stacked over a lower load lock chamber 204b. The upper load lock chamber 204a and the lower load lock chamber 204b may be operated independently so that substrate transferring between the front-end environment 202 and the first transfer chamber assembly 210 can be conducted in both directions simultaneously.

The load lock chambers 204a, 204b provide a first vacuum interface between the front-end environment 202 and the first transfer chamber assembly 210. In one embodiment, two load lock chambers 204a, 204b are provided to increase throughput by alternatively communicating with the first transfer chamber assembly 210 and the front-end environment 202. While one load lock chamber 204a or 204b communicates with the first transfer chamber assembly 210, a second load lock chamber 204b or 204a can communicate with the front-end environment 202.

In one embodiment, the load lock chambers 204a, 204b are a batch type load lock chamber that can receive two or more substrates from the factory interface, retain the substrates while the chamber is sealed and then evacuated to a low enough vacuum level to transfer of the substrates to the first transfer chamber assembly 210.

The internal volume of the first transfer chamber assembly 210 is defined by an internal volume 219 of the vacuum extension chamber 207 connected to an internal volume 220 of the transfer chamber 208. An opening 228 is formed between the transfer chamber 208 and the vacuum extension chamber 207. The opening 228 provides fluid communication between the vacuum extension chamber 207 and the transfer chamber 208, and are large enough to allow the central robot 209 to shuttle substrates to and from the load lock chamber 204.

A vacuum system 225 is coupled the vacuum extension chamber 207 and configured to provide a low pressure environment to both the internal volume 219 and the internal volume 220. A robotic mechanism 226 is coupled to the transfer chamber 208. The transfer chamber 208 and the vacuum extension chamber 207 are constructed to minimize the foot print of the cluster tool 200.

In the one hand, the duel load lock chamber improves system throughput by allowing simultaneous two way substrate transportation. In the other hand, stacked load lock chambers require more vertical access space. To allow the robot, such as the central robot 209, to access the stacked load lock chambers 204a, 204b and the shutter disk shelf 222, the shutter disk shelf 222 in the vacuum extension chamber 207 is made vertically movable. An indexer 224 is coupled to the shutter disk shelf 222 and is configured to vertically move the shutter disk shelf 222 into a position that allows unobstructed movement of the robot through the vacuum extension chamber 207. The shutter disk shelf 222 may be lowered to the lower portion of the internal volume 219 by the indexer 224 so that the central robot 209 interface with the shutter disk shelf 222 to pick up a shutter disk or drop a shutter disk to the shutter disk shelf 222.

As shown in FIG. 10, the pass through chamber 231 provides an interface between the first transfer chamber assembly 210 and the second transfer chamber assembly 230 allowing the first and second transfer chamber assemblies 210, 230 to have different levels of vacuum. In one embodiment, the pass through chamber 231 may comprise a temperature controlled substrate supports 246, 247 to prepare substrates for a subsequent processing step. In one embodiment, the substrate support 246 may be heated while the substrate support 247 may be cooled.

The internal volume of the second transfer chamber assembly 230 is defined by an internal volume 248 of the vacuum extension chamber 232 connected to an internal volume 249 of the transfer chamber 233. An opening 244 is formed between the transfer chamber 233 and the vacuum extension chamber 232. The opening 244 provides fluid communication between the vacuum extension chamber 232 and the transfer chamber 233, and are large enough to allow the central robot 234 to shuttle substrates to and from the pass through chamber 231.

A vacuum system 242 is coupled the vacuum extension and configured to provide a low pressure environment to both the internal volume 248 and the internal volume 249. A robotic mechanism 245 is coupled to the transfer chamber 233. The transfer chamber 233 and the vacuum extension chamber 232 are constructed to minimize the foot print of the cluster tool 200. In embodiment wherein the transfer chambers remain at the same vacuum level, only one of the vacuum systems may optionally be utilized.

As shown in FIG. 10, the shutter disk shelf 243 of the vacuum extension chamber 232 is stationary. The shutter disk shelf 243 is positioned on a lower portion of the internal volume 248 of the vacuum extension chamber 232 while the central robot 234 is configured to transfer substrates to and from the pass through chamber 231 through an upper portion of the internal volume 248.

It should be noted that any processing chambers connected to a transfer chamber may be replaced by a pass through and/or extension chamber so that another transfer chamber may be added to a cluster tool.

As shown in FIG. 10, the cluster tool 200 is supported by supporting legs 227. The supporting legs 227 provide vertical and lateral support to the mainframe and chambers of the cluster tool 200. Each of the supporting legs 227 may be vertically adjustable on site. The supporting legs 227 are coupled to sidewalls of the transfer chambers 208, 233, the vacuum extension chambers 207, 232, and/or the load lock chamber 204 and the pass through chamber 231 for lateral support to the cluster tool 200.

In one embodiment, four pairs supporting legs 227 may be used to support the cluster tool 200. One pair of supporting legs 227 are coupled to a backend (away from the front-end environment 202) of each of the transfer chambers 208, 233. Notches may be formed on the backend of the transfer chamber 208, 233 for providing lateral support to the supporting legs 227. A pair of supporting legs 227 is coupled to near a joint region of the load lock chamber 204 and the vacuum extension chamber 207. Another pair of supporting legs 227 is coupled to near a joint region of the pass through chamber 231 and the vacuum extension chamber 232.

Independent supporting legs of the present invention not only greatly reduces the cost compared a supporting frame, but also provide great flexibility to the system. If desired, the cluster tool of the present invention may also be transported with the independent supporting legs assembled.

Figure 11A:
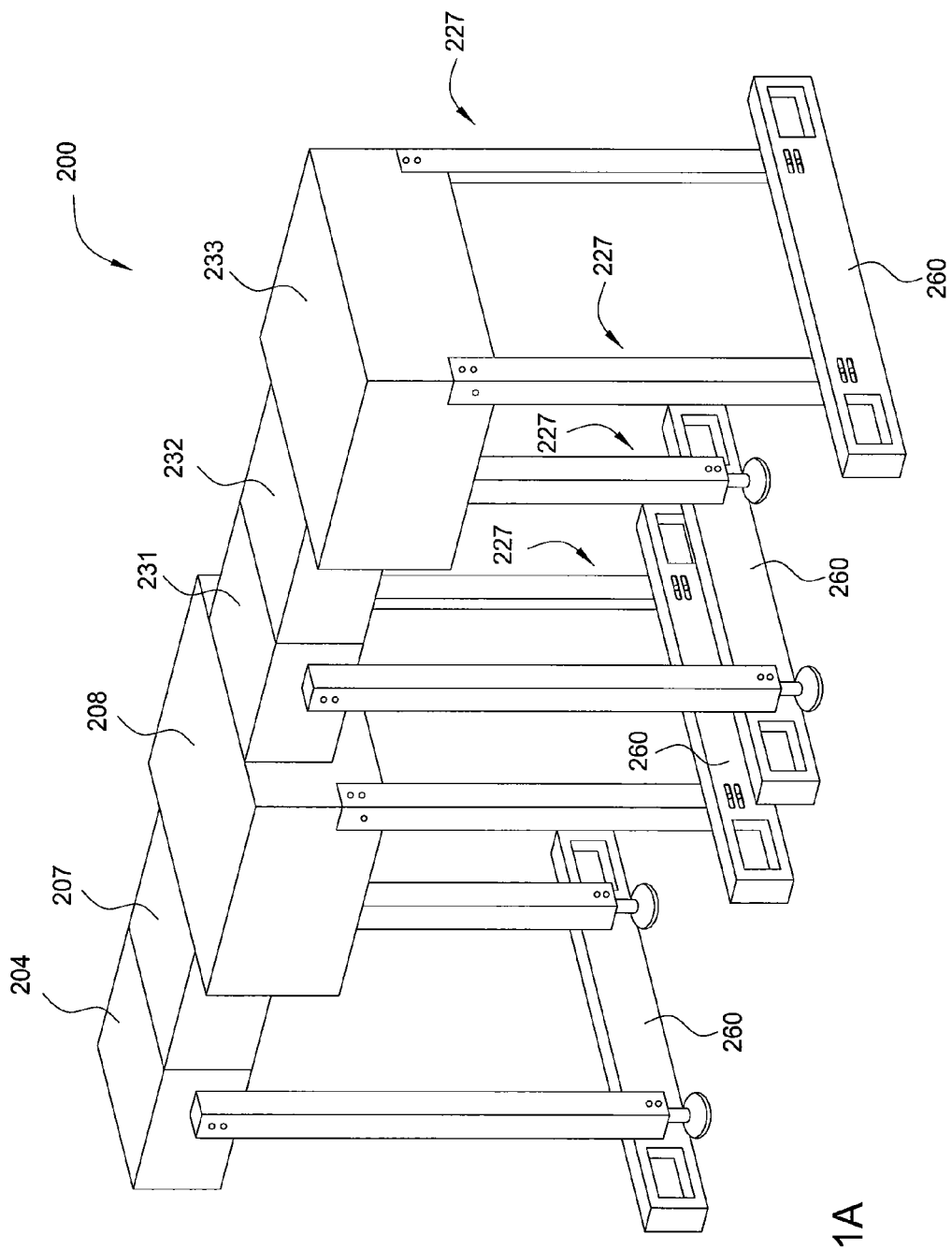
FIG. 11A schematically illustrates an isometric view of the cluster tool of FIG. 9 with transporting braces.

FIG. 11A schematically illustrates an isometric view of the cluster tool 200 of FIG. 9 with transporting braces 260 configured to engage the supporting legs 227 with transporting tools, such as a fork lift, for transporting the cluster tool 200 in a whole or partially assembled. One or more transporting braces 260 may be coupled to a cluster tool 200 for transporting the cluster tool 200 fully or partially assembled. In one embodiment, each of the transporting braces 206 is coupled to a pair of the independent supporting legs 127.

Figure 11B:
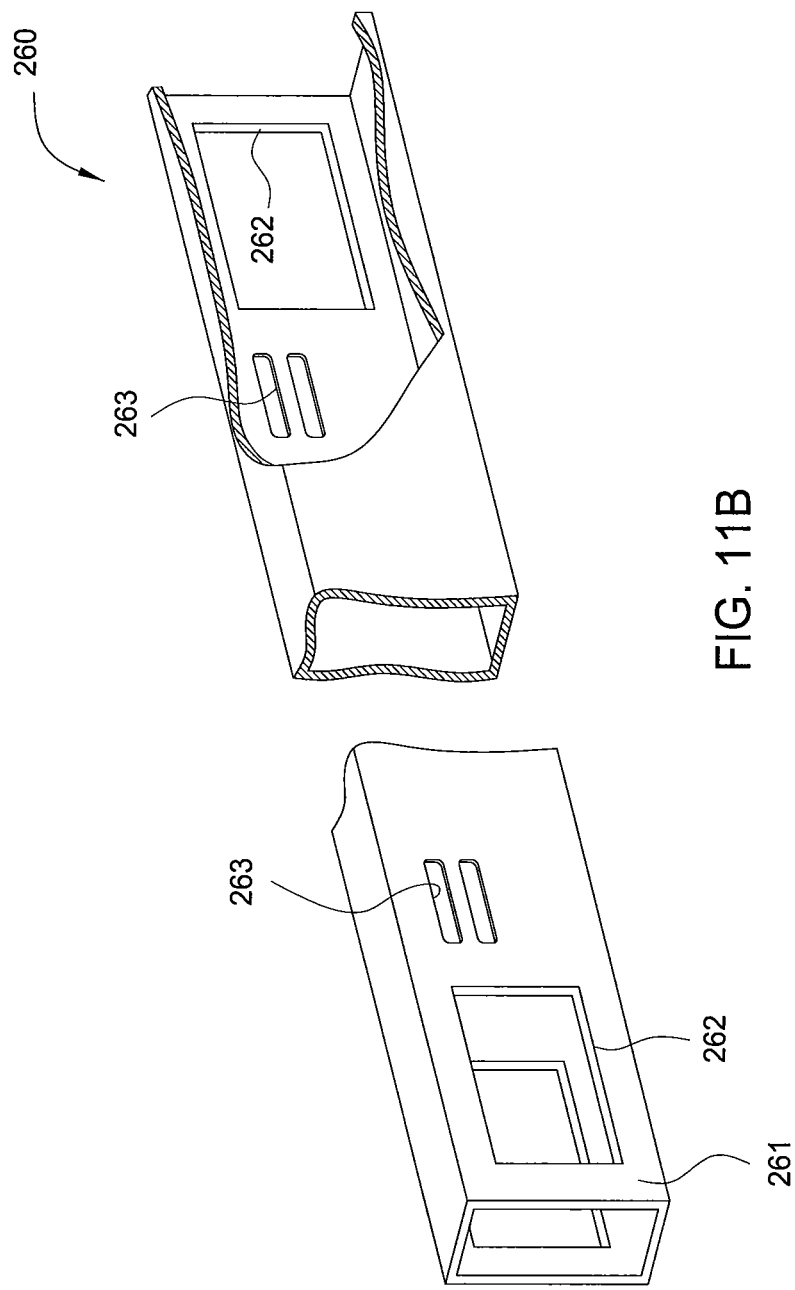
FIG. 11B schematically illustrates a transporting brace in accordance with one embodiment of the present invention.

FIG. 11B schematically illustrates the transporting brace 260 in accordance with one embodiment of the present invention. The transporting brace 260 has a elongated body 261 formed from a ridged material, such as steel, and aluminum. The body 261 may be a tube, for reduced weight, with a rectangular or squared shape. Two lifting openings 262 may be formed near two ends of the body 261. The lifting opening 262 is configured to provide interface to a lifting tool, such as a fork lift. Distance between the two lifting openings 262 on the transporting brace 260 may be configured to adapt a lifting tool, for example, to adapt a distance between the forks of a fork lift. In one embodiment, an independent supporting leg 227 may be bolted to the transporting brace 260 through one or more coupling holes 263 formed on the body 261. The coupling holes 263 may be elongated to provide tolerance on distance variations between a pair of independent supporting legs 227.

Referring back to FIG. 11A, one or more transporting braces 260 may be coupled to the independent supporting legs 227 of the cluster tool 200 at substantially similar elevation with the lifting openings 262 substantially aligned. A lifting tool may thread thought the lifting openings 262 of two or more transporting braces 260 to lift and transport the cluster tool 200.

The transporting braces of the present invention provide an interface and robust structure to supporting assembly, such as the independent supporting legs, during transportation. The transport braces may be easily coupled to and removed from the cluster tool for transportation and processing. The transport braces allow the cluster tool to have a simple, non obstructive supporting assembly using independent supporting legs, as well as a reinforced structure for transportation if needed.

Even though, a PVD process is describe in accordance with the present application, the cluster tools of the present invention may be used for any suitable processes.

While the foregoing is directed to embodiments of the present invention, other and further embodiments of the invention may be devised without departing from the basic scope thereof, and the scope thereof is determined by the claims that follow.

What is claimed is:

1. A transfer chamber, comprising:
   a main chamber body comprising a top, a bottom and a plurality of sidewalls defining a main volume, wherein each sidewall of the plurality of sidewalls has an opening formed therethrough;
   an extension chamber body comprising a top, a bottom, and at least a first sidewall and a second sidewall defining an extension volume, wherein the extension chamber body is separately connected to the opening formed in one of the sidewalls of the main chamber body, and the main volume and the extension volume are directly connected through the opening in the one of the sidewalls;
   a transfer robot mounted in the main chamber body, wherein rotation about a rotation centerline of the transfer robot in a fully retracted position defines a minimum radius from the rotation centerline to an end of the transfer robot that supports a substrate, wherein the minimum radius is greater than a distance from the rotation centerline to the opening formed through the plurality of sidewalls; and
   a vacuum pump mounted on the extension chamber body.

2. The transfer chamber of claim 1, further comprising chamber port assemblies mounted on remaining sidewalls of the main chamber body.

3. The transfer chamber of claim 2, wherein each chamber port assembly permits rotation of the transfer robot outside the main volume.

4. The transfer chamber of claim 1, wherein the main chamber body and the extension chamber body form a single vacuum enclosure controlled by the vacuum pump.

5. The transfer chamber of claim 1, further comprising a shutter disk shelf disposed in the extension volume of the extension chamber, the shutter disk shelf is configured to store one or more shutter disks to be used by one or more processing chambers coupled to the main chamber body, and the shutter disk shelf is accessible to the transfer robot.

6. The transfer chamber of claim 5, wherein the shutter disk shelf is disposed in a first portion of the extension volume of the extension chamber body, and a second portion of the extension volume of the extension chamber body is configured to provide a passage for the transfer robot to access a load lock chamber or a pass through chamber connected to the extension chamber body.

7. The transfer chamber of claim 6, wherein the shutter disk shelf is disposed in a lower portion of the extension volume.

8. The transfer chamber of claim 6, wherein the shutter disk shelf is movably disposed in the extension volume.

9. The transfer chamber of claim 8, further comprising an indexer connected to the shutter disk shelf, wherein the indexer is configured to transfer the shutter disk shelf vertically in the extension chamber body so that the shutter disk shelf is accessible to the transfer robot.

10. A cluster tool configured to process one or more substrates, comprising:
a first transfer chamber comprising:
a main chamber body comprising a top, a bottom and a plurality of sidewalls defining a main volume, wherein each of the sidewalls has an opening formed therethrough;
an extension chamber body comprising a top, a bottom, and at least a first sidewall and a second sidewall defining an extension volume, wherein the extension chamber body is separately connected to one of the sidewalls of the main chamber body, and the main volume and the extension volume are directly connected through the opening in the one of the sidewalls;
a transfer robot mounted in the main chamber body, wherein rotation about a rotation centerline of the transfer robot in a fully retracted position defines a minimum radius from the rotation centerline to an end of the transfer robot that supports the substrates, wherein the minimum radius is greater than a distance from the rotation centerline to each opening formed through the plurality of sidewalls; and
a vacuum pump mounted on the extension chamber body;
one or more processing chambers connected to one or more sidewalls of the main chamber body of the first transfer chamber; and
a load lock chamber connected to the extension chamber body of the first transfer chamber.

11. The cluster tool of claim 10, further comprising:
a second transfer chamber comprising:
a main chamber body comprising a top, a bottom and a plurality of sidewalls defining a main volume, wherein each of the sidewalls has an opening formed therethrough;
an extension chamber body comprising a top, a bottom, and at least a first sidewall and a second sidewall defining an extension volume, wherein the extension chamber body is separately connected to one of the sidewalls of the main chamber body, and the main volume and the extension volume are directly connected through the opening in the one of the sidewalls;
a transfer robot mounted in the main chamber body, wherein rotation of the transfer robot must define a minimum radius for a cylindrical volume extending from the main volume into the extension volume and each opening formed through the plurality of sidewalls; and
a vacuum pump mounted on the extension chamber body; and
a pass through chamber coupled between the first transfer chamber and the second transfer chamber.

12. The cluster tool of claim 11, further comprising one or more processing chambers connected to the second transfer chamber.

13. The cluster tool of claim 10, wherein the main chamber body and the extension chamber body of the first transfer chamber form a single vacuum enclosure controlled by the vacuum pump.

14. The cluster tool of claim 10, wherein the first transfer chamber further comprises a shutter disk shelf disposed in the extension volume of the extension chamber, the shutter disk shelf is configured to store one or more shutter disks to be used by one or more processing chambers coupled to the main chamber body, and the shutter disk shelf is accessible to the transfer robot.

15. The cluster tool of claim 14, wherein the shutter disk shelf is disposed in a first portion of the extension volume of the extension chamber body, and a second portion of the extension volume of the extension chamber body is configured to provide a passage for the transfer robot to access the load lock chamber connected to the extension chamber body.

16. The cluster tool of claim 15, wherein the shutter disk shelf is disposed in a lower portion of the extension volume.

17. The cluster tool of claim 15, wherein the shutter disk shelf is movably disposed in the extension volume.

18. The cluster tool of claim 17, wherein the first transfer chamber further comprises an indexer connected to the shutter disk shelf, and the indexer is configured to transfer the shutter disk shelf vertically in the extension chamber body so that the shutter disk shelf is accessible to the transfer robot.

19. The cluster tool of claim 14, wherein the shutter disk shelf comprises:
a first post;
a second post disposed opposing the first post; and
one or more pairs supporting fingers extending from each of the first and second posts, wherein the one or more pairs of supporting fingers form one or more slots, and each slot is configured to support one shutter disk thereon.

20. The cluster tool of claim 19, wherein each of the supporting fingers comprises two contact balls configured to be in contact with a back side of a shutter disk.

* * * * *